United States Patent
Thompson et al.

(10) Patent No.: US 11,473,974 B2
(45) Date of Patent: Oct. 18, 2022

(54) SUPERCONDUCTING PHOTON DETECTOR

(71) Applicant: PsiQuantum Corp., Palo Alto, CA (US)

(72) Inventors: Mark Thompson, Palo Alto, CA (US); Faraz Najafi, Palo Alto, CA (US)

(73) Assignee: PSIQUANTUM CORP., Palo Alto, CA (US)

( * ) Notice: Subject to any disclaimer, the term of this patent is extended or adjusted under 35 U.S.C. 154(b) by 0 days.

(21) Appl. No.: 16/985,137

(22) Filed: Aug. 4, 2020

(65) Prior Publication Data
US 2021/0190584 A1    Jun. 24, 2021

Related U.S. Application Data

(63) Continuation of application No. PCT/US2019/016885, filed on Feb. 6, 2019.

(60) Provisional application No. 62/627,115, filed on Feb. 6, 2018.

(51) Int. Cl.
| | |
|---|---|
| *G01J 1/44* | (2006.01) |
| *G01J 1/04* | (2006.01) |
| *G02B 6/42* | (2006.01) |
| *H01L 39/10* | (2006.01) |

(52) U.S. Cl.
CPC ............. *G01J 1/44* (2013.01); *G01J 1/0407* (2013.01); *G02B 6/4202* (2013.01); *H01L 39/10* (2013.01); *G01J 2001/442* (2013.01)

(58) Field of Classification Search
CPC ...... G01J 1/44; G01J 1/0407; G01J 2001/442; G02B 6/4202; H01L 39/10
See application file for complete search history.

(56) References Cited

U.S. PATENT DOCUMENTS

| | | |
|---|---|---|
| 3,059,196 A | 10/1962 | Lentz |
| 3,119,076 A | 1/1964 | Schlig et al. |
| 3,283,282 A | 11/1966 | Rosenberg |
| 4,336,561 A | 6/1982 | Murphy |
| 4,365,317 A | 12/1982 | Gheewala |

(Continued)

FOREIGN PATENT DOCUMENTS

| | | |
|---|---|---|
| CN | 106289515 A | 1/2017 |
| CN | 106549099 | 3/2017 |

(Continued)

OTHER PUBLICATIONS

Najafi, Notice of Allowance, U.S. Appl. No. 16/046,807, dated Oct. 29, 2019, 7 pgs.

(Continued)

*Primary Examiner* — Georgia Y Epps
*Assistant Examiner* — Don J Williams
(74) *Attorney, Agent, or Firm* — Morgan, Lewis & Bockius LLP

(57) ABSTRACT

The various embodiments described herein include methods, devices, and systems for fabricating and operating superconducting photon detectors. In one aspect, a photon detector includes: (1) a first waveguide configured to guide photons from a photon source; (2) a second waveguide that is distinct and separate from the first waveguide and optically-coupled to the first waveguide; and (3) a superconducting component positioned adjacent to the second waveguide and configured to detect photons within the second waveguide.

11 Claims, 11 Drawing Sheets

(56) References Cited

U.S. PATENT DOCUMENTS

| | | |
|---|---|---|
| 4,509,146 A | 4/1985 | Wang et al. |
| 4,647,954 A | 3/1987 | Graf et al. |
| 4,989,051 A | 1/1991 | Whitehead et al. |
| 5,026,682 A | 6/1991 | Clark et al. |
| 5,030,614 A | 7/1991 | Hollander et al. |
| 5,030,617 A | 7/1991 | Legge |
| 5,041,880 A | 8/1991 | Nojima et al. |
| 5,051,787 A | 9/1991 | Hasegawa |
| 5,053,383 A | 10/1991 | Short et al. |
| 5,127,928 A | 7/1992 | Farries et al. |
| 5,173,620 A | 12/1992 | Fujimaki et al. |
| 5,219,826 A | 6/1993 | Kapitulnik |
| 5,247,475 A | 9/1993 | Hasunuma et al. |
| 5,321,004 A | 6/1994 | Perez et al. |
| 5,365,476 A | 11/1994 | Mukhanov |
| 5,376,626 A | 12/1994 | Drehman et al. |
| 5,455,519 A | 10/1995 | Ohori |
| 5,481,119 A | 1/1996 | Higashino et al. |
| 5,521,862 A | 5/1996 | Frazier |
| 5,574,290 A | 11/1996 | You |
| 5,719,105 A | 2/1998 | Odagawa et al. |
| 5,825,240 A | 10/1998 | Geis et al. |
| 5,831,278 A | 11/1998 | Berkowitz |
| 5,892,644 A | 4/1999 | Evans |
| 5,925,892 A | 7/1999 | Mizuno et al. |
| 6,029,075 A | 2/2000 | Das et al. |
| 6,078,517 A | 6/2000 | Herr |
| 6,242,939 B1 | 6/2001 | Nagasawa |
| 6,433,974 B2 | 8/2002 | Heismann |
| 6,774,463 B1 | 8/2004 | Chaudhari et al. |
| 6,900,714 B1 | 5/2005 | Huang et al. |
| 7,227,438 B2 | 6/2007 | Song et al. |
| 7,513,765 B2 | 4/2009 | Liao |
| 7,558,030 B2 | 7/2009 | Lee et al. |
| 7,589,323 B2 | 9/2009 | Tanaka et al. |
| 7,724,083 B2 | 5/2010 | Herring et al. |
| 7,847,282 B2 | 12/2010 | Sandhu |
| 7,852,106 B2 | 12/2010 | Herr et al. |
| 8,330,145 B2 | 12/2012 | Wakana et al. |
| 8,565,844 B2 | 10/2013 | Smith |
| 8,577,430 B1 | 11/2013 | Smith |
| 8,736,085 B2 | 5/2014 | Sines |
| 9,293,240 B2 | 3/2016 | Kroulik |
| 9,443,576 B1 | 9/2016 | Miller |
| 9,500,519 B2 | 11/2016 | Tang et al. |
| 9,509,315 B2 | 11/2016 | McCaughan et al. |
| 9,853,645 B1 | 12/2017 | Mukhanov et al. |
| 9,876,505 B1 | 1/2018 | Dai et al. |
| 9,954,158 B2 | 4/2018 | You et al. |
| 9,998,122 B2 | 6/2018 | Hamilton et al. |
| 10,103,736 B1 | 10/2018 | Powell et al. |
| 10,133,986 B1 | 11/2018 | Newton et al. |
| 10,171,086 B2 | 1/2019 | McCaughan et al. |
| 10,177,298 B1 | 1/2019 | Taylor et al. |
| 10,186,858 B2 | 1/2019 | Klaus et al. |
| 10,197,440 B2 | 2/2019 | Najafi |
| 10,262,776 B2 | 4/2019 | Choi et al. |
| 10,361,703 B2 | 7/2019 | Najafi |
| 10,386,229 B2 | 8/2019 | Najafi et al. |
| 10,396,733 B2 | 8/2019 | Najafi et al. |
| 10,454,014 B2 | 10/2019 | Najafi et al. |
| 10,454,016 B2 | 10/2019 | Fong et al. |
| 10,566,516 B2 | 2/2020 | Najafi |
| 10,573,800 B1 | 2/2020 | Najafi |
| 10,586,910 B2 | 3/2020 | Najafi |
| 10,620,044 B2 | 4/2020 | Thompson et al. |
| 10,651,325 B2 | 5/2020 | Najafi et al. |
| 10,879,905 B2 | 12/2020 | Najafi et al. |
| 10,897,235 B2 | 1/2021 | Najafi et al. |
| 10,911,031 B2 | 2/2021 | Wise et al. |
| 10,944,403 B2 | 3/2021 | Najafi |
| 10,984,857 B2 | 4/2021 | Najafi |
| 11,009,387 B2 | 5/2021 | Chung et al. |
| 2002/0149453 A1 | 10/2002 | Snitchler et al. |
| 2003/0087503 A1 | 5/2003 | Sakaguchi et al. |
| 2005/0153843 A1 | 7/2005 | Kubota |
| 2005/0197254 A1 | 9/2005 | Stasiak et al. |
| 2006/0073979 A1 | 4/2006 | Thieme et al. |
| 2006/0183327 A1 | 8/2006 | Moon |
| 2006/0270224 A1 | 11/2006 | Song et al. |
| 2008/0026234 A1 | 1/2008 | Sambasivan et al. |
| 2008/0197285 A1* | 8/2008 | Frey .............. G01J 1/0209 250/336.2 |
| 2008/0272302 A1* | 11/2008 | Frey .............. G01J 1/42 250/336.2 |
| 2009/0014433 A1 | 1/2009 | O'Neil et al. |
| 2010/0026447 A1 | 2/2010 | Keefe et al. |
| 2010/0171098 A1 | 7/2010 | Suzuki |
| 2011/0108803 A1 | 5/2011 | Deligianni et al. |
| 2011/0116742 A1 | 5/2011 | Chang |
| 2011/0254053 A1 | 10/2011 | Goupil et al. |
| 2013/0012392 A1 | 1/2013 | Tanaka et al. |
| 2013/0090244 A1 | 4/2013 | Shinzato et al. |
| 2013/0124112 A1 | 5/2013 | Heath et al. |
| 2013/0143744 A1 | 6/2013 | Marsili et al. |
| 2013/0341594 A1 | 12/2013 | Mohseni et al. |
| 2014/0113828 A1 | 4/2014 | Gilbert et al. |
| 2014/0299751 A1 | 10/2014 | Tang et al. |
| 2015/0018218 A1 | 1/2015 | Lakrimi et al. |
| 2015/0179916 A1 | 6/2015 | Pramanik et al. |
| 2015/0348681 A1 | 12/2015 | Huh |
| 2016/0028402 A1 | 1/2016 | McCaughan et al. |
| 2016/0028403 A1 | 1/2016 | McCughan et al. |
| 2016/0356708 A1 | 12/2016 | Bennett |
| 2017/0186933 A1 | 6/2017 | Sunter et al. |
| 2018/0033944 A1 | 2/2018 | Ladizinsky et al. |
| 2018/0145664 A1 | 5/2018 | Herr et al. |
| 2018/0335343 A1 | 11/2018 | Najafi et al. |
| 2018/0364097 A1 | 12/2018 | Najafi |
| 2018/0374979 A1 | 12/2018 | Nozawa |
| 2019/0027672 A1 | 1/2019 | Megrant |
| 2019/0035904 A1 | 1/2019 | Najafi |
| 2019/0035999 A1 | 1/2019 | Najafi |
| 2019/0044051 A1 | 2/2019 | Caudillo et al. |
| 2019/0109595 A1 | 4/2019 | Najafi |
| 2019/0148848 A1 | 5/2019 | Najafi et al. |
| 2019/0227230 A1 | 7/2019 | Novack |
| 2019/0288132 A1 | 9/2019 | Wang et al. |
| 2019/0378874 A1 | 12/2019 | Rosenblatt et al. |
| 2020/0066962 A1 | 2/2020 | Najafi |
| 2020/0080890 A1 | 3/2020 | Najafi et al. |
| 2020/0111944 A1 | 4/2020 | Moodera et al. |
| 2020/0176662 A1 | 6/2020 | Dayton et al. |
| 2020/0194656 A1 | 6/2020 | Najafi |
| 2020/0256722 A1 | 8/2020 | Najafi et al. |
| 2021/0183767 A1 | 6/2021 | Najafi et al. |
| 2021/0239518 A1 | 8/2021 | Chung et al. |

FOREIGN PATENT DOCUMENTS

| | | |
|---|---|---|
| DE | 2440576 B1 | 1/1976 |
| DE | 19714191 C1 | 7/1998 |
| EP | 0299879 A2 | 1/1989 |
| EP | 1965184 A1 | 9/2008 |
| GB | 2530500 A | 3/2016 |
| JP | S63299282 A | 12/1988 |
| JP | H05-55647 A | 3/1993 |
| WO | WO90/14715 A1 | 11/1990 |
| WO | WO94/09566 A1 | 4/1994 |
| WO | WO/2012052628 A1 | 4/2012 |

OTHER PUBLICATIONS

Najafi, Notice of Allowance, U.S. Appl. No. 16/136,124, dated Apr. 4, 2019, 8 pgs.

Najafi, Notice of Allowance, U.S. Appl. No. 16/136,124, dated Jun. 27, 2019, 8 pgs.

Najafi, Corrected Notice of Allowance, U.S. Appl. No. 16/136,124, dated Sep. 23, 2019, 2 pgs.

PsiQuantum Corp., International Search Report and Written Opinion, PCT/US2018/060802, dated Apr. 8, 2019, 6 pgs.

PsiQuantum, International Preliminary Report on Patentability, PCT/US2018/060802, dated May 19, 2020, 13 pgs.

(56) References Cited

OTHER PUBLICATIONS

Najafi, Notice of Allowance, U.S. Appl. No. 16/773,921, dated Sep. 22, 2021, 8 pgs.
Akhlaghi et al., "Gated Mode Superconducting Nanowire Single Photon Detectors," Optics Express, vol. 20, No. 2, Jan. 16, 2012, 9 pgs.
Atikian, Haig A. et al., "Superconducting Nanowire Single Photon Detector on Diamond," arXiv:1401.4490v1, physics.optics, Jan. 17, 2014, 5 pgs.
Cheng, Risheng et al., "Photon-Number-Resolving Detector Based on Superconducting Serial Nanowires," IEEE Transactions on Applied Superconductivity, vol. 23, No. 1, Feb. 2013, 9 pgs.
Clem, John R. et al., "Geometry-dependent critical currents in superconducting nanocircuits," arXiv:1109.4881v1 [cond-mat.supr-con] Sep. 22, 2011, 29 pgs.
Dai, Daoxin et al., "Mode conversion in tapered submicron silicon ridge optical waveguides," Optics Express, vol. 20, No. 12, Jun. 4, 2012, 15 pgs.
Henrich, D. et al., "Geometry-inducted reduction of the critical current in superconducting nanowires," arXiv:1204.0616v2 [cond-mat-supr-con] Aug. 22, 2012, 6 pgs.
Hortensius, H.L. et al., "Critical-Current Reduction in Thin Superconducting Wires Due to Current Crowding," arXiv:1203.4253v3, [cond-mat-supr-con], May 6, 2012, 5 pgs.
Korzh, B.A. et al., "Demonstrating sub-3 ps temporal resolution in a superconducting nanowire single-photon detector," Apr. 18, 2018, 26 pgs.
Lee, S.-B. et al., "Fabrication of a self-aligned superconducting nanotransistor based NOR logic gate," Microelectronic Engineering 57-58, 2001, 7 pgs., downloaded from https://www.sciencedirect.com/science/article/abs/pii/S0167931701004269).
Marsili, F., "Single-photon detectors based on ultra-narrow superconducting nanowires," Massachusetts Institute of Technology, Department of Electrical Engineering and Computer Science, Dec. 19, 2010, 31 pgs.
Mattioli, Francesco et al., "Photon-number-resolving superconducting nanowire detectors," Superconductor Science and Technology, Aug. 24, 2015, 16 pgs.
McGaughan, "Superconducting thin film nanoelectronics," Sep. 2015, Massachusetts Institute of Technology, submitted to the Department of Electrical Engineering and Computer Science in partial fulfillment of the requirements for the degree of Doctor of Philosopy in Electrical Engineering, 22 pgs.
Murphy et al., "Nanoscale superconducting memory based on the kinetic inductance of asymmetric nanowire loops," Departmwent of Physics, University of Illinois at Urbana-Champaign, arXiv:1701.08715v2 [cond-mat.supr-con] Jun. 29, 2017, 19 pgs.
Natarajan et al., "Superconducting nanowire single-photon detectors: physics and applications", 2012, Superconduc. Sci. Technology vol. 25, p. 063001.
Quaranta et al., Superconductive Three-Terminal Amplifier/Discriminator, IEEE Transactions on Applied Superconductivity, vol. 19, No. 3, Jun. 2, 2009, 4 pgs.
Schmidt, E. et al., AIN-Buffered Superconducting NbN Nanowire Single-Photon Detector on GaAs, IEEE Transactions on Applied Superconductivity, vol. 27, No. 4, Jun. 2017, 5 pgs.
Shiino, Tatsuya et al., "Improvement of Critical Temperature of Superconducting NbTiN and NbN Thin Films Using the AIN Buffer Layer," Superconductor Science and Technology, Mar. 2010, 11 pgs.
Zhao, Qing-Yuan et al., "A compact superconducting nanowire memory element operated by nanowire cryotrons," Massachusetts Institute of Technology, Department of Electrical Engineering and Computer Science, Nov. 22, 2017, 20 pgs.
PsiQuantum Corp., International Search Report and Written Opinion, PCT/US2018/033042, dated Aug. 28, 2018, 13 pgs.
PsiQuantum Corp., International Search Report and Written Opinion, PCT/US2018/033041, dated Jul. 27, 2018, 16 pgs.
PsiQuantum Corp., International Search Report and Written Opinion, PCT/US2018/044091, dated Nov. 7, 2018, 13 pgs.
PsiQuantum Corp., Invitation to Pay Additional Fees/Partial Search Report, PCT/US2018/037892, dated Aug. 20, 2018, 12 pgs.
PsiQuantum Corp., Invitation to Pay Additional Fees/Partial Search Report, PCT/US2018/054414, dated Jan. 24, 2019, 21 pgs.
PsiQuantum Corp., International Search Report and Written Opinion, PCT/US2018/054414, dated Mar. 20, 2019, 21 pgs.
Najafi, Office Action dated Dec. 12, 2018, U.S. Appl. No. 16/028,288, 6 pgs.
Najafi, Notice of Allowance dated Apr. 5, 2019, U.S. Appl. No. 16/028,288, 10 pgs.
Najafi, Office Action dated Sep. 21, 2018, U.S. Appl. No. 16/028,293, 8 pgs.
Najafi, Final Office Action dated Mar. 1, 2019 U.S. Appl. No. 16/028,293, 5 pgs.
Najafi, Notice of Allowance dated Sep. 21, 2018, U.S. Appl. No. 16/012,520, 9 pgs.
Najafi, Office Action, U.S. Appl. No. 16/136,124, dated Apr. 4, 2019, 9 pgs.
Najafi, Quayle Office Action, U.S. Appl. No. 16/151,180, dated Jan. 31, 2019, 5pgs.
Najafi, Notice of Allowace, U.S. Appl. No. 16/151,180, dated Mar. 14, 2019, 5 pgs.
Najafi, Notice of Allowance U.S. Appl. No. 16/151,190, dated Feb. 6, 2019, 11 pgs.
Najafi, Notice of Allowance U.S. Appl. No. 16/151,190, dated Mar. 28, 2019, 5 pgs.
Najafi, Office Action, U.S. Appl. No. 16/046,815, dated Feb. 4, 2019, 9 pgs.
Najafi, Office Action, U.S. Appl. No. 16/046,807, dated Mar. 18, 2019, 10 pgs.
Najafi, Office Action, U.S. Appl. No. 16/107,143, dated Mar. 19, 2019, 11 pgs.
PsiQuantum Corp., International Search Report and Written Opinion, PCT/US2019/017687, dated Apr. 30, 2019, 8 pgs.
Stanfield, CMOS-Compatible, Piezo-Optomechanically Tunable Photonics for Visible Wavelengths and Cryogenic, Temperatures, vol. 27, Issue 20, pp. 28588-28605, 2019.
PsiQuantum Corp., International Search Report, PCT/US2019/017691, dated Apr. 23, 2019, 7 pgs.
PsiQuantum Corp., International Search Report and Written Opinion, PCT/US2019/030019, dated Jul. 17, 2019, 8 pgs.
PsiQuantum Corp., PCT/US2018/044091, International Preliminary Report on Patentability, dated Jan. 28, 2020, 6 pgs.
Najafi, Non-Final Office Action, U.S. Appl. No. 16/664,716, dated Apr. 1, 2020, 14 pgs.
PsiQuantum, International Search Report / Written Opinion, PCT/US2019/051853, dated Jan. 27, 2020, 13 pgs.
PsiQuantum, International Preliminary Report on Patentability, PCT/US12018/033041, dated Nov. 26, 2019, 8 pgs.
PsiQuantum, International Preliminary Report on Patentability, PCT/US2018/054414, dated Apr. 8, 2020, 15 pgs.
PsiQuantum, International Search Report / Written Opinion, PCT/US2018/037892, dated Oct. 17, 2018, 18 pgs.
PsiQuantum, International Preliminary Report on Patentability, PCT/US2018/037892, dated Dec. 17, 2019, 12 pgs.
Najafi, Non-Final Office Action, U.S. Appl. No. 16/553,068, dated Apr. 1, 2020, 11 pgs.
Najafi, Non-Final Office Action, U.S. Appl. No. 16/544,718, dated Aug. 17, 2020, 6 pgs.
Najafi, Non-Final Office Action, U.S. Appl. No. 16/656,506, dated Aug. 13, 2020, 18 pgs.
Najafi, Notice of Allowance, U.S. Appl. No. 16/553,068, dated Sep. 18, 2020, 8 pgs.
Najafi, Notice of Allowance, U.S. Appl. No. 16/473,550, dated Sep. 24, 2020, 8 pgs.
Najafi, Notice of Allowance, U.S. Appl. No. 16/473,550, dated Nov. 3, 2020, 2 pgs.
Najafi, Notice of Allowance, U.S. Appl. No. 16/553,068, dated Nov. 12, 2020, 2 pgs.
Najafi, Notice of Allowance, U.S. Appl. No. 16/656,506, dated Nov. 3, 2020, 12 pgs.
Najafi, Final Office Action, U.S. Appl. No. 16/664,716, dated Oct. 16, 2020, 14 pgs.

(56) References Cited

OTHER PUBLICATIONS

Najafi, Notice of Allowance, U.S. Appl. No. 16/473,547, dated Dec. 9, 2020, 8 pgs.
Najafi, Notice of Allowance, U.S. Appl. No. 16/543,256, dated Dec. 9, 2020, 12 pgs.
Chung, Non-Final Office Action, U.S. Appl. No. 16/849,829, dated Aug. 21, 2020, 5 pgs.
Chung, Notice of Allowance, U.S. Appl. No. 16/849,829, dated Dec. 8, 2020, 5 pgs.
PsiQuantum Corp., International Search Report / Written Opinion, PCT/US20/28519, dated Jan. 12, 2021, 9 pgs.
PsiQuantum Corp., Notice of Allowance, U.S. Appl. No. 16/849,829, dated Mar. 1, 2021, 8 pgs.
PsiQuantum Corp., Notice of Allowance, U.S. Appl. No. 16/544,718, dated Feb. 5, 2021, 6 pgs.
PsiQuantum Corp., Notice of Allowance, U.S. Appl. No. 16/664,716, dated Jan. 28, 2021, 8 pgs.
PsiQuantum Corp., Notice of Allowance, U.S. Appl. No. 16/473,547, dated Jan. 27, 2021, 2 pgs.
PsiQuantum Corp., Notice of Allowance, U.S. Appl. No. 16/543,256, dated Feb. 4, 2021, 2 pgs.
PsiQuantum Corp., Notice of Allowance, U.S. Appl. No. 16/544,718, dated Mar. 12, 2021, 2 pgs.
PsiQuantum Corp., Notice of Allowance, U.S. Appl. No. 16/544,718, dated Mar. 24, 2021, 2 pgs.
PsiQuantum Corp., Notice of Allowance, U.S. Appl. No. 16/849,829, dated Apr. 5, 2021, 2 pgs.
PsiQuantum, Notice of Allowance, U.S. Appl. No. 16/840,166, dated Mar. 23, 2021, 7 pgs.
PsiQuantum, Notice of Allowance, U.S. Appl. No. 16/544,718, dated Apr. 26, 2021, 2 pgs.
PsiQuantum, Notice of Allowance, U.S. Appl. No. 16/664,716, dated Apr. 21, 2021, 8 pgs.
PsiQuantum, Notice of Allowance, U.S. Appl. No. 16/664,716, dated May 7, 2021, 2 pgs.
PsiQuantum, Notice of Allowance, U.S. Appl. No. 16/543,256, dated Mar. 24, 2021, 2 pgs.
PsiQuantum, Notice of Allowance, U.S. Appl. No. 16/575,274, dated Apr. 22, 2021, 10 pgs.
PsiQuantum, International Preliminary Report on Patentability, PCT/US2018/033042, dated Nov. 19, 2019, 7 pgs.
PsiQuantum, International Search Report, PCT/US2018/033041, dated Jul. 27, 2018, 12 pgs.
PsiQuantum, International Preliminary Report on Patentability, PCT/US2019/051853, dated Mar. 23, 2021, 10 pgs.
PsiQuantum, International Preliminary Report on Patentability, PCT/US2019/017687, dated Aug. 18, 2020, 6 pgs.
PsiQuantum, International Preliminary Report on Patentability, PCT/US2019/030019, dated Nov. 3, 2020, 7 pgs.
PsiQuantum, Notice of Allowance, U.S. Appl. No. 16/840,166, dated May 24, 2021, 5 pgs.
Najafi, Non-Final Office Action, U.S. Appl. No. 16/623,503, dated Jun. 23, 2021, 15 pgs.
Najafi, Notice of Allowance, U.S. Appl. No. 16/840,166, dated Jul. 21, 2021, 2 pgs.
Najafi, Non-Final Office Action, U.S. Appl. No. 17/135,861, dated Sep. 23, 2021, 6 pgs.
PsiQuantum, International Preliminary Report on Patentability, PCT/US2019/016885, dated Aug. 11, 2020, 7 pgs.
PsiQuantum, International Search Report and Written Opinion, PCT/US2019/016885, dated Apr. 24, 2019, 9 pgs.
Thompson, Non-Final Office Action, U.S. Appl. No. 16/450,911, dated Aug. 2, 2019, 6 pgs.
Thompson, Notice of Allowance, U.S. Appl. No. 16/450,911, dated Dec. 11, 2019, 5 pgs.
Najafi, Notice of Allowance, U.S. Appl. No. 17/195,522, dated Nov. 12, 2021, 8 pgs.
Najafi, Notice of Allowance, U.S. Appl. No. 17/195,522, dated Nov. 16, 2021, 2 pgs.
Najafi, Notice of Allowance, U.S. Appl. No. 16/773,921, dated Nov. 15, 2021, 8 pgs.
Najafi, Notice of Allowance, U.S. Appl. No. 16/623,503, dated Feb. 22, 2022, 10 pgs.
Najafi, Notice of Allowance, U.S. Appl. No. 17/195,522, dated Feb. 9, 2022, 2 pgs.
Najafi, Notice of Allowance, U.S. Appl. No. 17/135,861, dated Feb. 15, 2022, 2 pgs.
Najafi, Notice of Allowance, U.S. Appl. No. 16/773,921, dated Feb. 16, 2022, 2 pgs.
Najafi, Non-Final Office Action, U.S. Appl. No. 16/813,628, dated Mar. 7, 2022, 7 pgs.
Najafi, Notice of Allowance, U.S. Appl. No. 17/033,337, dated Feb. 25, 2022, 7 pgs.
Najafi, Notice of Allowance, U.S. Appl. No. 17/135,861, dated Jan. 28, 2022, 7 pgs.
Najafi, Notice of Allowance, U.S. Appl. No. 17/033,337, dated Dec. 9, 2021, 8 pgs.
McCaughan, A.N., et al., "Using Geometry to Sense Current," Nano Letters 16 (2016), 6 pgs.
Chung, Non-Final Office Action, U.S. Appl. No. 17/232,086, dated Dec. 16, 2021, 6 pgs.
Najafi, Notice of Allowance, U.S. Appl. No. 17/195,522, dated Dec. 9, 2021, 2 pgs.
Najafi, Notice of Allowance, U.S. Appl. No. 16/773,921, dated Dec. 24, 2021, 2 pgs.
Najafi, Notice of Allowance, U.S. Appl. No. 17/195,522, dated Jan. 7, 2022, 2 pgs.
Chung, Notice of Allowance, U.S. Appl. No. 17/232,086, dated May 11, 2022, 6 pgs.
Najafi, Notice of Allowance, U.S. Appl. No. 17/033,337, dated Mar. 16, 2022, 2 pgs.
Najafi, Notice of Allowance, U.S. Appl. No. 17/135,861, dated Mar. 15, 2022, 2 pgs.
Najafi, Notice of Allowance, U.S. Appl. No. 16/623,503, dated Mar. 11, 2022, 3 pgs.
Najafi, Notice of Allowance, U.S. Appl. No. 16/623,503, dated Mar. 22, 2022, 3 pgs.
Najafi, Non-Final Office Action, U.S. Appl. No. 17/160,283, dated Mar. 31, 2022, 18 pgs.
Najafi, Non-Final Office Action, U.S. Appl. No. 17/234,701, dated Feb. 1, 2022, 14 pgs.
Najafi, Non-Final Office Action, U.S. Appl. No. 16/840,182, dated Apr. 29, 2022, 12 pgs.
U.S. Appl. No. 16/450,911, filed Jun. 24, 2019. This application issued as U.S. Pat. No. 10,620,044.

* cited by examiner

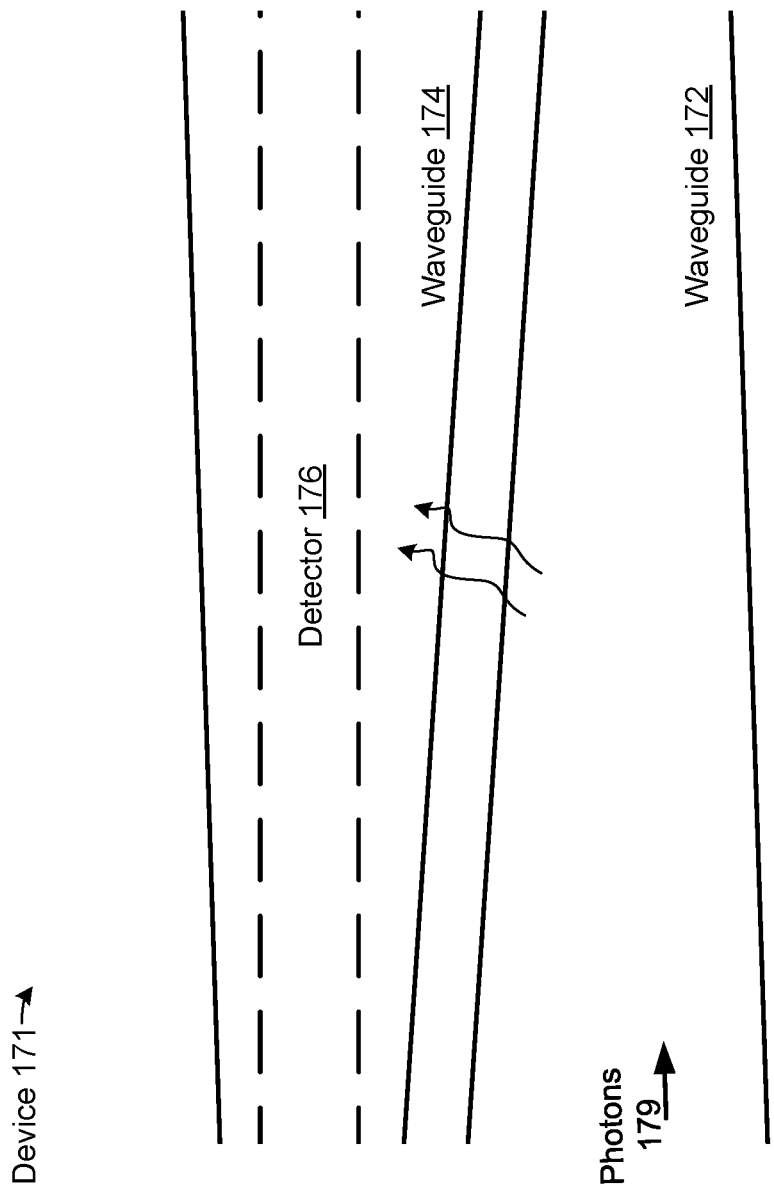

SUPERCONDUCTING PHOTON DETECTOR

RELATED APPLICATIONS

This application is a continuation of PCT International Application Serial No. PCT/US2019/016885, filed Feb. 6, 2019, which claims priority to U.S. Provisional Application No. 62/627,115, filed Feb. 6, 2018, which are incorporated by reference herein in their entireties.

This application is also related to U.S. patent application Ser. No. 16/450,991, filed Jun. 24, 2019, now U.S. Pat. No. 10,620,044, which is incorporated by reference herein in its entirety.

TECHNICAL FIELD

This relates generally to photon detectors, including but not limited to, superconducting photon detectors.

BACKGROUND

Photon detectors are essential components in many electronic devices. Ultra-sensitive photon detectors that are capable of detecting a small number of photons, such as individual photons (e.g., single photons), are used in a variety of applications, such as optical communications, medical diagnostics, and space research. One such use of ultra-sensitive photon detectors is for optical quantum information applications.

Current crowding effects (e.g., due to a non-uniform shape) lead to limitations in efficiency and yield of many conventional photon detectors. For example, current crowding may lead to a reduced current density in some parts of the detector that create blind spots, and conversely lead to an increased current density in other parts of the detector that can reduce the critical current of the detector, thereby impacting performance and yield.

SUMMARY

There is a need for systems and/or devices with efficient and effective methods for detecting photons. Such systems, devices, and methods optionally complement or replace conventional systems, devices, and methods for detecting photons.

Photon detectors typically include one or more electrical components to generate an electrical signal in response to a received photon. In nanowire-based single photon detectors, current crowding due to the non-uniform and/or non-straight nature of nanowires leads to limitations in detection efficiency and/or yield. For example, in a hair-pin configuration, an overlap of the optical field with the tip of the hair pin nanowire results in lower detection efficiency due to the non-uniform current distribution in the bend of the nanowire. The non-uniform current distribution in the bend of the nanowire leads to: (1) a reduced current density in some parts of the nanowire, which creates blind spots, and (2) an increased current density in other parts of the nanowire, which reduces the threshold current of the device, thereby impacting overall device performance.

The present disclosure describes photon detector systems and methods that utilize optically-coupled waveguides integrated with a superconducting nanowire, which operates as a photon detection element. These systems and methods provide several advantages compared to conventional nanowire-based photon detectors: (1) they reduce or eliminate current crowding within superconducting nanowires; (2) they reduce or eliminate blind spots in the superconducting nanowires; (3) they allow for accurate control of detection efficiency (e.g., the transfer efficiency can be adjusted without changing the detector geometry); and (4) they are scalable to multi-element devices.

In some embodiments, using two waveguides separated by a gap, light is coupled to only a uniform straight section of a waveguide integrated with a nanowire detector. In some embodiments, the waveguides are arranged and sized so that light adiabatically transfers between the waveguides. In some embodiments, the waveguides are arranged and sized so that light evanescently transfers between the waveguides. In some embodiments, the widths of the two waveguides and the gap between the two waveguides is configured to allow light to efficiency and adiabatically couple from the input waveguide to the waveguide containing the nanowire detector. In accordance with some embodiments, as the light couples into the waveguide with the nanowire detector, it is absorbed by the nanowire resulting in the detection of an input photon.

In accordance with some embodiments, the waveguides are designed to couple any preselected portion of the received light into the detector. In some embodiments, the amount of light coupled into the detector is based on a length and gap of the coupler. In some embodiments, the amount of light coupled into the detector is based on the waveguide width and nanowire properties. In some embodiments, the waveguides are configured and/or positioned to couple light only toward a detection zone (e.g., a narrow, straight section) of the nanowire. This reduces and/or avoids blind spots or absorption of light in detector areas with reduced detection efficiency.

In accordance with some embodiments, the multi-element detector is used to enable the detection of multiple photons. In some embodiments, the multi-element detector is used to overcome a detection refresh time limitation of a single detector element. In some embodiments, the coupling efficiency for each detector is controlled to allow a uniform probability of detection across all detector elements. For example, a first detector element (or a waveguide integrated with the first detector element) has a weaker coupling efficiency than subsequent detector elements (or waveguides respectively integrated with respective subsequent detector elements) to enable uniform probability of absorption across the multiple detector elements.

In one aspect, some embodiments include a photon detector having: (1) a first waveguide configured to guide photons from a photon source; (2) a second waveguide that is distinct and separate from the first waveguide and optically-coupled (e.g., adiabatically or evanescently) to the first waveguide; and (3) a superconducting component positioned adjacent to the second waveguide and configured to detect photons within the second waveguide.

In another aspect, some embodiments include a method for detecting photons, the method including: (1) receiving one or more photons from a photon source; (2) directing the one or more photons through a first waveguide; (3) optically transferring at least one photon of the one or more photons from the first waveguide to a second waveguide that is distinct and separate from the first waveguide; and (4) detecting the at least one photon within the second waveguide using a photon sensor positioned adjacent to the second waveguide.

In yet another aspect, some embodiments include a method of fabricating a photon detector, the method including: (1) providing a substrate; (2) depositing a layer of a waveguide material over the substrate; (3) adapting the layer of the waveguide material into a first waveguide and a second waveguide that is distinct and separate from the first waveguide; and (4) forming a photon sensor over the second waveguide.

In yet another aspect, some embodiments include a directional coupler device having: (1) a first photonic waveguide including a first region and a second region that is distinct from and mutually exclusive to the first region of the first photonic waveguide, where: (a) the first region of the first photonic waveguide has a linear shape with a first end and a second end that is opposite to the first end of the first region of the first photonic waveguide; and (b) the first region of the first photonic waveguide is configured to receive one or more photons travelling from the first end of the first region of the first photonic waveguide toward the second end of the first region of the first photonic waveguide; (2) a second photonic waveguide that is distinct and separate from the first photonic waveguide, the second photonic waveguide including a first region and a second region that is distinct from and mutually exclusive to the first region of the second photonic waveguide, where: (a) the first region of the second photonic waveguide is linear in shape and positioned adjacent to the first region of the first photonic waveguide; (b) the first region of the second photonic waveguide is a first distance from the first photonic waveguide, and the second region of the second photonic waveguide is a second distance to the first photonic waveguide, that is greater than the first distance; (c) the first region of the second photonic waveguide has a first end and a second end that is opposite to the first end of the first region of the second photonic waveguide; and (d) at least a subset of the one or more photons transmitted from the first end of the first region of the first photonic waveguide toward the second end of the first region of the first photonic waveguide is transferred to the second photonic waveguide; and (3) a superconducting detector component having a first portion and a second portion that is distinct from and mutually exclusive to the first portion of the superconducting component, where: (a) the first portion of the superconducting detector component is linear in shape and positioned adjacent to the first region of the second photonic waveguide; (b) the first portion of the superconducting detector component spans the first region of the second photonic waveguide; and (c) at least a portion of the first portion of the superconducting detector component transitions from a superconducting state to a non-superconducting state in response to one or more incident photons transmitted from the first waveguide.

Thus, devices and systems are provided with methods for fabricating and operating superconducting photodetector circuitry, thereby increasing the effectiveness, efficiency, and user satisfaction with such systems and devices.

BRIEF DESCRIPTION OF THE DRAWINGS

For a better understanding of the various described embodiments, reference should be made to the Detailed Description below, in conjunction with the following drawings in which like reference numerals refer to corresponding parts throughout the figures.

FIG. 1G is a cross-sectional view of an example optical device in accordance with some embodiments.

Like reference numerals refer to corresponding parts throughout the several views of the drawings.

DETAILED DESCRIPTION

Figure 1A:
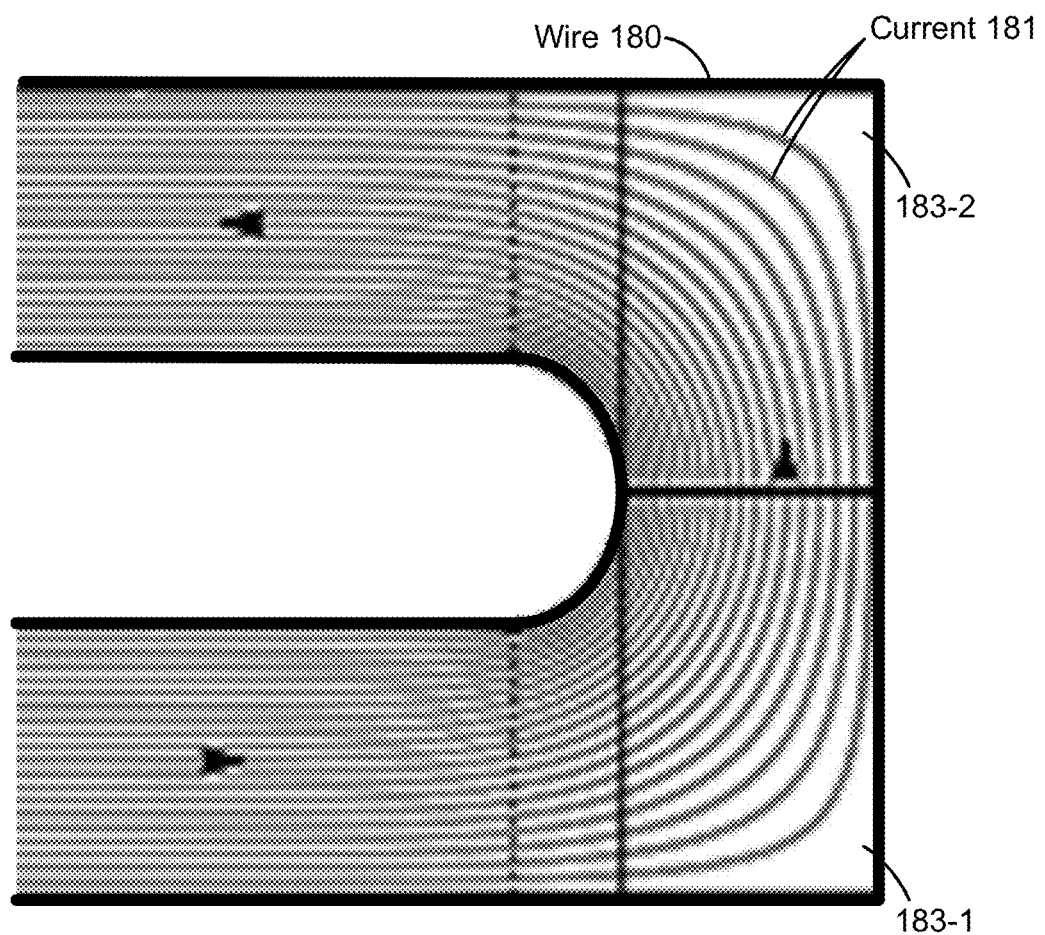
FIG. 1A is a schematic diagram illustrating current crowding effects within a non-linear wire in accordance with some embodiments.

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Many modifications and variations of this disclosure can be made without departing from its spirit and scope, as will be apparent to those skilled in the art. The specific embodiments described herein are offered by way of example only, and the disclosure is to be limited only by the terms of the appended claims, along with the full scope of equivalents to which such claims are entitled.

The present disclosure describes systems and devices that incorporate superconducting photon detector(s), such as superconducting nanowire single photon detectors (SNSPDs), in a waveguide coupler configuration (e.g., a directional coupler). In some embodiments, a superconducting nanowire is positioned adjacent to a detector waveguide that is optically-coupled to an input waveguide to form a directional coupler (e.g., an asymmetric coupler due to the presence of the nanowire). In some embodiments, the waveguides, and superconducting nanowire, are sized and positioned so that the coupling efficiency of the directional coupler exceeds 90%, 95%, or 99%.

Such systems and devices provide advantages when compared to the conventional detector-to-waveguide coupling schemes. For example, in accordance various embodiments, the disclosed systems and devices: (1) reduce or eliminate current crowding effects within the nanowire devices; (2) reduce or eliminate blind spots in the detector; (3) allow for accurate control of coupling to the detector, e.g., the absorption in the detector can be adjusted without changing the detector geometry; (4) are more robust towards drift and sidewall defects in the detector as compared to conventional devices; (5) are scalable to multi-element optical detection systems; and (6) minimize back reflections due to index of refraction changes within the waveguides.

A further advantage of the disclosed systems and devices is ease of fabrication. In accordance with some embodiments, the disclosed systems and devices reduce and/or eliminate bends in the active structure. Straight (linear) sections of nanowires are generally more accurately and consistently fabricated as compared to sections with bends or curves, which can lead to irregularities, constrictions, defects, and the like.

In some embodiments, an optical system includes a directional coupler (e.g., an asymmetric coupler) with an input waveguide and a detector waveguide separated by a gap (e.g., an air gap or dielectric gap), and with the detector waveguide containing an integrated nanowire detector. In some embodiments, the integrated nanowire detector is on a same die as the detector waveguide. For example, the integrated nanowire detector is fabricated in a same process as the detector waveguide. In some embodiments, the waveguides are arranged and sized such that light is evanescently coupled to a uniform, straight section of the nanowire detector via the two waveguides. Evanescent coupling (also sometimes called "evanescent field coupling" or "evanescent wave coupling") occurs when waveguides are positioned so that the evanescent field generated within one waveguide excites a wave in the other waveguide, leading to transmission of light between the waveguides. In some embodiments, the waveguides are arranged and sized such that light is adiabatically coupled to a uniform, straight section of the nanowire detector via the two waveguides. Adiabatic coupling occurs when waveguides are positioned so that an optical mode within one waveguide transitions to an analogous mode within the other waveguide.

In some embodiments, the widths of the two waveguides, and optionally the sizing of the gap between the two waveguides, are configured to allow light to optically couple from the input waveguide and into the detector waveguide with high coupling efficiency (e.g., greater than 90%, 95%, or 99%). In accordance with some embodiments, as the light couples into the detector waveguide, it is absorbed by the nanowire detector resulting in a detection signal from the nanowire detector. In accordance with some embodiments, coupling the detector to the detector waveguide, rather than the input waveguide, reduces reflection of photons that travel via the waveguides. In some embodiments, the gap distance between the waveguides is adjusted to reduce or minimize the reflection of photons within the waveguides and allow adiabatic coupling between the waveguides.

In accordance with some embodiments, an optical system is configured to couple any preselected portion of the light from the input waveguide into the detector. In some embodiments, the amount of light coupled into the detector is based on a length and gap of the coupler. In some embodiments, the amount of light coupled into the detector is based on the waveguide width and nanowire properties. In some embodiments, the waveguides are configured and/or positioned to couple only to a detection zone (e.g., a narrow, straight section) of the nanowire. Coupling to the detection zone reduces and/or avoids blind spots or absorption of light in detector areas with reduced detection efficiency.

In accordance with some embodiments, the multi-element detector is used to enable the detection of multiple photons, as described in detail below with respect to FIGS. 4A-4B. In some embodiments, the multi-element detector is used to overcome a detection refresh time limitation of a single detector element. In some embodiments, the coupling efficiency for each detector is preset to allow a uniform probability of detection across all detector elements. For example, a first detector element is configured to have a weaker coupling efficiency than subsequent detector elements, thereby presenting a uniform probability of absorption across the multiple detector elements.

As described below, the disclosed devices and system provide advantages over conventional photon detectors. First, absorption of light only in straight sections of the nanowire detectors avoids current redistribution issues that may lead to trade-offs in current density and photo-sensitivity. Second, the amount of light coupled into the nanowire detector is adjustable by changing a coupling length and/or a coupling gap distance (rather than adjusting parameters of the nanowire detector itself). Thus, a same detector waveguide with an integrated nanowire detector layout and design may be used for each detector element of a multi-element detector system, which eases design of the multi-detector system and may reduce requirements for the electronic control and read-out circuitry. Third, the disclosed devices and system allow for adiabatic coupling to the nanowire detectors that, for example, reduce back reflection due to the impendence mismatch.

As used herein, a "superconducting" material is a material that is capable of operating in a superconducting state (under particular conditions). For example, a superconducting material is a material that operates as a superconductor (e.g., operates with zero electrical resistance) when cooled below a particular temperature (e.g., a critical temperature) and having less than a maximum current flowing through it. A superconducting material is also called herein a superconduction-capable material. The superconducting materials may also operate in an "off" state where little or no current is present. In some embodiments, the superconducting materials operate in a non-superconducting state during which the materials have a non-zero electrical resistance (e.g., a resistance in the range of one thousand to ten thousand ohms). For example, a superconducting material supplied with a current greater than a threshold superconducting current for the superconducting material may transition from a superconducting state with zero electrical resistance to a non-superconducting state with non-zero electrical resistance.

As used herein, a "wire" is a section of material configured for transferring electrical current. In some embodiments, a wire includes a section of material conditionally capable of transferring electrical current (e.g., a wire made of a superconducting material that is capable of transferring electrical current while the wire is maintained at a temperature below a critical temperature). A cross-section of a wire (e.g., a cross-section that is perpendicular to a length of the wire) optionally has a geometric (e.g., flat or round) shape or a non-geometric shape. In some embodiments, a length of a wire is greater than a width or a thickness of the wire (e.g., the length of a wire is at least 5, 6, 7, 8, 9, or 10 times greater than the width and the thickness of the wire).

FIG. 1A is a schematic diagram illustrating current crowding effects within a non-linear wire in accordance with some embodiments. FIG. 1A shows a non-linear wire 180 (e.g., a wire with a hair-pin turn) with current 181 flowing through the wire. As shown in FIG. 1A, the non-linearity of the wire 180 results in current crowding along the inner radius of the turns in the wire 180 and potential blind spots 183 along the outer radius of the turns. In implementations in which the wire 180 is utilized as a photon detector, photons incident to the blind spots 183 may not be detected.

For example, if the wire 180 is a superconducting wire, it has an associated superconducting current density threshold. To operate as a photon detector, the wire 180 may be coupled to a bias current that is configured to maintain the superconducting wire "just below" the superconducting current density threshold, such that energy from a single photon is sufficient to transition the wire from a superconducting state to a non-superconducting state. In this example, transitioning from the superconducting state to the non-superconducting state is interpreted as detection of an incident photon. However, because the current density of the wire 180 is greater at the inner radius than the outer radius, the bias current is constrained by the inner radius density. Additional current density at the outer radius generated from a photon incident to one of the blind spots 183 may therefore be insufficient to cause the superconducting wire to transition from the superconducting state to the non-superconducting state. Thus, photons incident to the blind spots may not be detected.

Figure 1B:
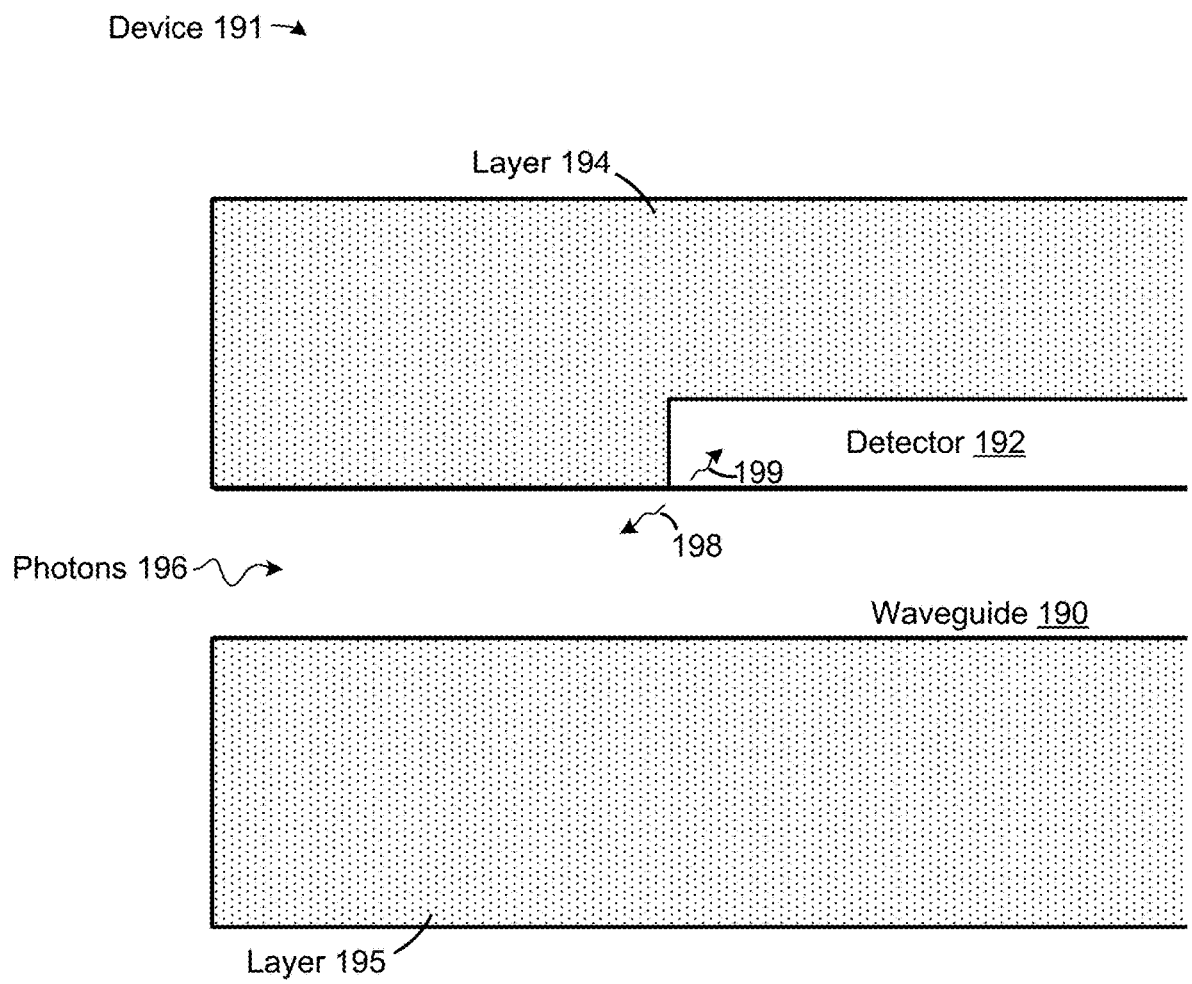
FIG. 1B is a cross-sectional view of an example optical device in accordance with some embodiments.

FIG. 1B is a cross-sectional view of an optical device 191 in accordance with some embodiments. As shown in FIG. 1B, the optical device 191 includes a waveguide 190 optically-coupled with a detector 192 (e.g., a superconducting detector). The optical device 191 further includes layers 194 and 195 (e.g., dielectric layers) that cover the top and bottom of the waveguide 190 and the detector 192. In some embodiments, layers 194 and 195 serve as the upper cladding and lower cladding, respectively, of the waveguide 190, e.g., the index of refraction of the layers 194 and 195 is lower than the index of refraction of the waveguide 190. However, in the region of the waveguide 190 that includes detector 192, the index of refraction profile in the upper cladding is modified slightly from its bulk value due to the presence of the thin detector layer that is interposed between layer 194 and waveguide 190. As a result, photons 196 that originally propagate in the waveguide 190 experience an abrupt change in refractive index when they encounter the detector layer region and can be partially reflected (i.e., some of the input light from photons 196 can be back reflected as reflection 198). Accordingly, some of the photons 196 that were initially propagating in the waveguide 190 cannot enter the region of the waveguide that includes detector 192 (because they are back reflected). Thus the efficiency of optical device 191 is lowered (e.g., fewer photons 199 are able to be absorbed by detector layer 192). Utilizing a directional coupler configuration (e.g., as described with below respect to FIGS. 1C-1F) reduces, or minimizes, reflections due to changes in the index of refraction.

Figure 1C:
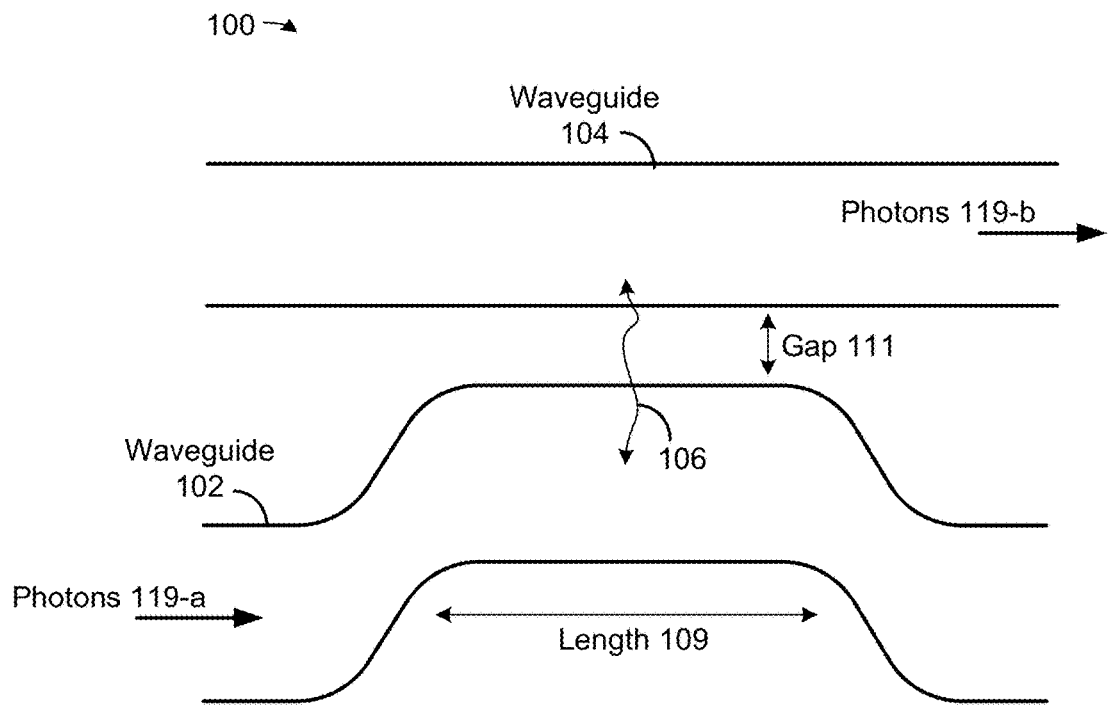
FIGS. 1C-1F are schematic diagrams illustrating representative optical devices in accordance with some embodiments.

FIGS. 1C-1F are schematic diagrams illustrating representative optical devices in accordance with some embodiments. FIG. 1C shows an optical device 100 including a first waveguide 102 in proximity with a second waveguide 104. In accordance with some embodiments, the waveguides 102 and 104 are optically coupled (e.g., evanescently or adiabatically). In optically-coupled waveguides, photons transfer between the waveguides as represented by arrows 106. In some embodiments, the waveguides 102 and 104 are phase matched. FIG. 1C further shows photons 119 traveling from position 119-a in waveguide 102 to position 119-b in waveguide 104 via the optical coupling 106. In some embodiments, the gap 111 between the waveguides is configured to provide a particular transfer rate between the waveguides 102 and 104 (e.g., between 0% and 100%). For example, the gap 111 is between 100 nanometers and 500 nanometers. In some embodiments, the length 109 of a region of the waveguide 102 in proximity to the waveguide 104 is configured to provide a particular transfer rate (e.g., in addition to, or alternatively to, selecting the gap 111). For example, the length 109 is between 1 micron and 100 microns. In some embodiments, the waveguides 102 and 104 have respective widths between 250 nanometers and 1000 nanometers. In some embodiments, the waveguides 102 and 104 have respective heights between 100 nanometers and 1 micron. In some embodiments, the waveguides 102 and 104 are composed of silicon. In some embodiments, the waveguides 102 and 104 include silicon (e.g., silica, silicon oxynitride, etc.). In some embodiments, the waveguides 102 and 104 include germanium.

Figure 1D:
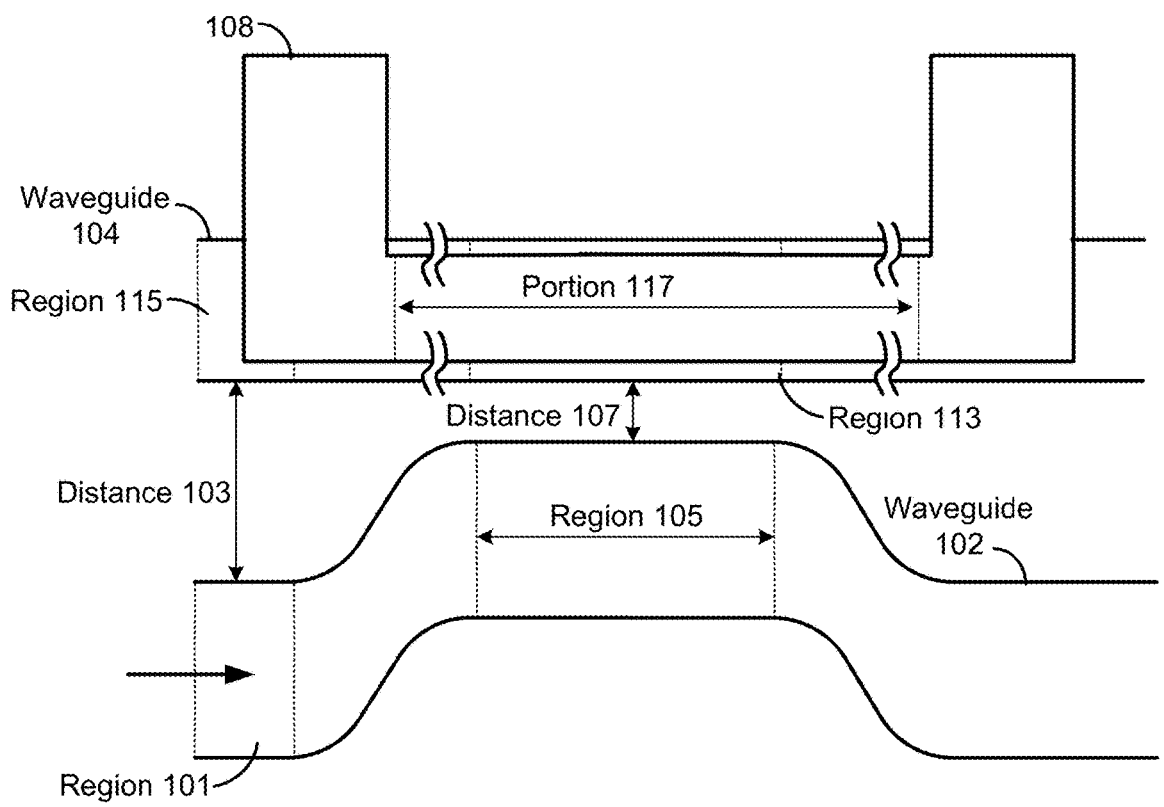
Figure 3A:
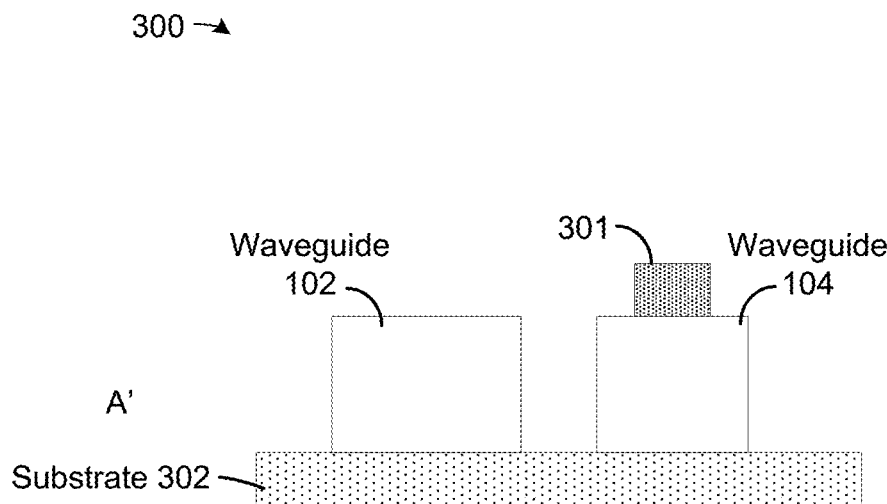
FIGS. 3A-3B are cross-sectional views of example optical devices in accordance with some embodiments.
Figure 3B:
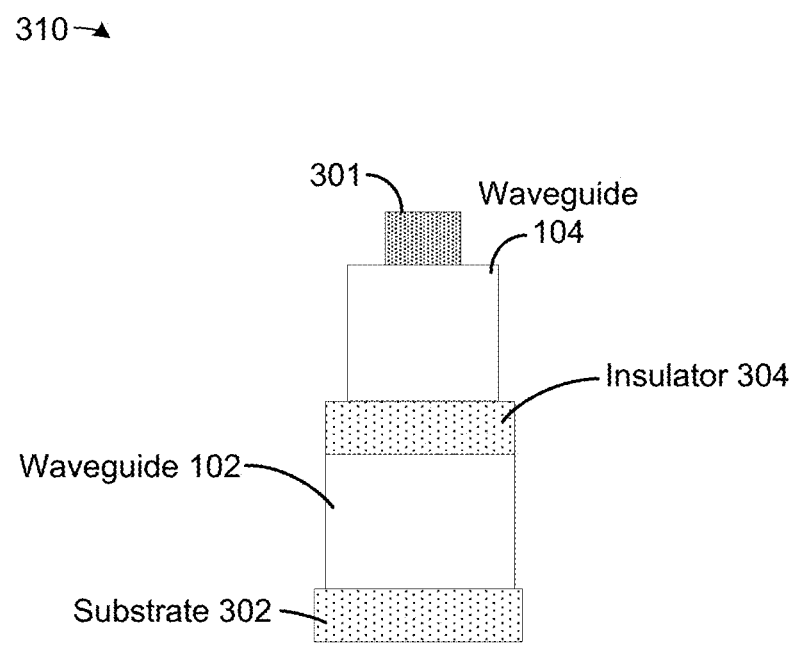

FIG. 1D shows the optical device 100 of FIG. 1C with the addition of a superconducting component 108 coupled to the waveguide 104. FIG. 1D further shows the first waveguide 102 having a region 101 that is located at a distance 103 from a region 115 of the second waveguide 104 and a region 105 that is located at a distance 107 from a region 113 of the second waveguide 104. FIG. 1D also shows the superconducting component 108 having a portion 117 adjacent to the region 113 of the second waveguide 104. Optionally, the portion 117 of the superconducting detector component adjacent to region 113 is vertically stacked with region 113 of the second waveguide 104, for example as shown in FIG. 3B. In some embodiments, the portion 117 of the superconducting component 108 is in contact with the region 113 of the waveguide 104. In some embodiments, the portion 117 of the superconducting component 108 is separated from the region 113 of the waveguide 104 by one or more dielectric layers. In some embodiments, a thickness of the one or more dielectric layers is below a threshold thickness so that the portion 117 of the superconducting component 108 is capable of detecting one or more photons passing through, or received by, the region 113 of the waveguide 104. In some embodiments, as shown in FIG. 1D, the superconducting component 108 is aligned (e.g., directly across from) the region 105, while in other embodiments, the superconducting component 108 is offset (e.g., shifted to the left or right) from the region 105. In some embodiments, the superconducting component 108 is arranged and sized so as to prevent optical coupling between the ends of the superconducting component 108 and the waveguide 102. In some embodiments, the length of the portion 117 is sufficiently larger than the region 105 to prevent optical coupling between the ends of the superconducting component 108 and the waveguide 102.

In accordance with some embodiments, a directional coupling configuration is utilized in FIG. 1D to reduce, or minimize, reflections within the waveguides, e.g., such as back reflections as light encounters an abrupt change in an index of refraction. Reflections are reduced by using a directional coupling. In some embodiments, a coupling coefficient between the waveguide 102 and the waveguide 104 is dependent on the distance 107 and the length of region 105. In some embodiments, the length of the region 105 and the coupling distance 108 are selected to achieve a desired coupling coefficient. In some embodiments, the distance 107 and/or the length 105 is adjusted to change a coupling efficiency between the waveguides. In some embodiments, the superconducting component 108 is arranged and sized such that an index of refraction between the regions 105 and 113 is constant.

Figure 1E:
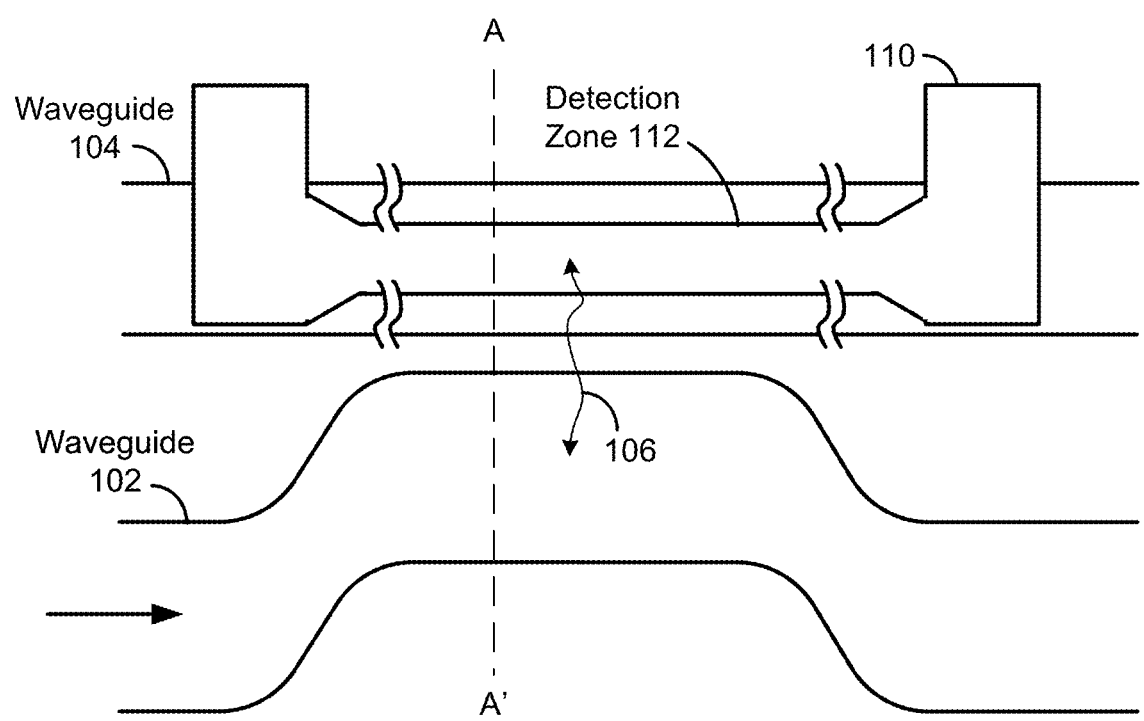

FIG. 1E shows the optical device 100 of FIG. 1C with the addition of a superconducting component 110 coupled to the waveguide 104. The superconducting component 110 in FIG. 1E includes a detection zone 112 configured to detect photons within the waveguide 104 (e.g., photons transferring from the waveguide 102). In some embodiments, the superconducting components 108 and 110 comprise superconducting nanowires. In some embodiments, the detection zone 112 comprises a straight, uniform region such a superconducting threshold current density for the detection zone is constant throughout the detection zone 112. In some embodiments, the detection zone 112 is configured to reduce or eliminate blind spots. In some embodiments, the non-detecting portions of the detectors vary in shape and size (e.g., have rounded corners and/or other geometric and non-geometric shapes). In some embodiments, the superconducting components 108 and 110 are configured so as to detect single photons received by the waveguide 104 (e.g., detect a single photon at a particular time). In some embodiments, the superconducting components 108 and 110 are configured so as to detect a threshold amount of photons (e.g., 10, 20, or 100 photons). Line AA' in FIG. 1E represents a plane upon which the cross-sectional view shown in FIG. 3A is taken. In some embodiments, the superconducting components 108 and 110 have respective detection widths between 10 nanometers and 200 nanometers. For example, the superconducting component 110 has widths between 200 nanometers and 2 microns with the detection zone 112 having a width between 10 nanometers and 200 nanometers. In some embodiments, the superconducting components 108 and 110 have respective heights between 3 nanometers and 10 nanometers. In some embodiments, the superconducting component 110 is arranged and sized so as to prevent optical coupling between the non-detecting portions of the superconducting component 110 and the waveguide 102.

Figure 1F:
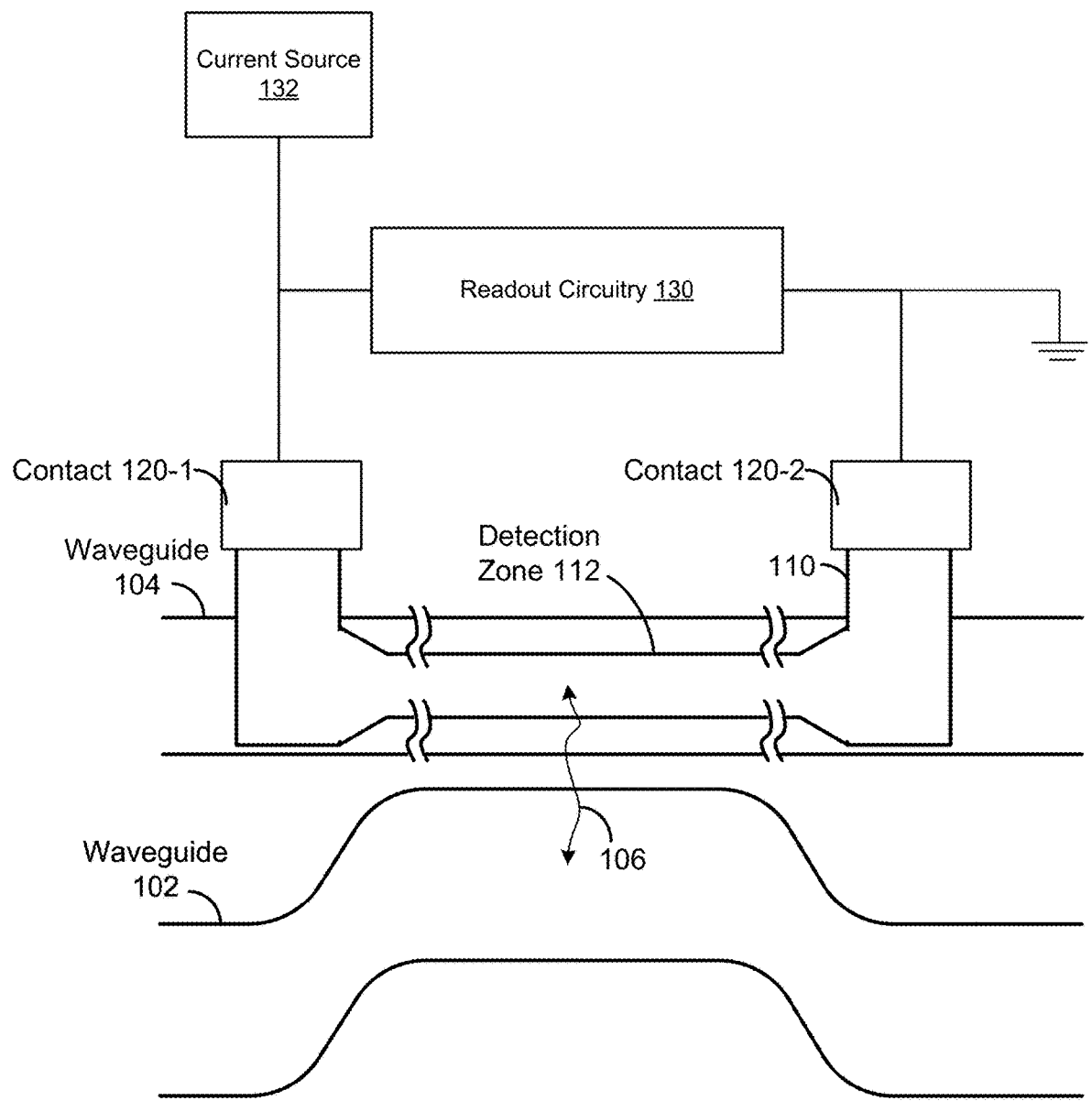

FIG. 1F shows the optical device of FIG. 1E with the addition of readout circuitry 130 and a current source 132 coupled to the superconducting component 110 via contacts 120. In some embodiments, the contacts 120 are electrically-conductive (e.g., are composed of gold, copper, or the like). In some embodiments, the readout circuitry 130 comprises one or more superconducting components. In some embodiments, the readout circuitry 130 is configured to determine when the superconducting component 110 is in a non-superconducting state. In some embodiments, the readout circuitry 130 is configured to determine when the superconducting component 110 has received a threshold number of photons. In some embodiments, the readout circuitry 130 is configured to measure a portion of current received from the current source 132. In some embodiments, the readout circuitry 130 is separated from the current source 132 by one or more resistors, such that a threshold amount of current from the current source 132 only flows through the readout circuitry 130 when the superconducting component 110 is in a non-superconducting state (e.g., in response to receiving a threshold amount of photons). In some embodiments, the readout circuitry 130 is coupled in parallel with the superconducting component 110, while in other embodiments, the readout circuitry 130 is coupled in series with the superconducting component 110 (e.g., and is configured to determine a voltage drop associated with the superconducting component 110). In some embodiments, (not shown) a voltage source is coupled to the superconducting component 110 (e.g., in addition to, or alternatively to, the current source 132). Additional details regarding operation and readout of photon detectors can be found in U.S. patent application Ser. No. 16/028,293, filed Jul. 5, 2018, entitled "Gated Superconducting Photon Detector."

Although FIG. 1F shows readout circuitry 130 and current source 132 coupled to the superconducting component 110, in some embodiments, the readout circuitry 130 and current source 132 are coupled to a different superconducting component, such as superconducting component 108 in FIG. 1D.

FIG. 1G is a cross-sectional view of an optical device 171 in accordance with some embodiments. The optical device 171 includes an input waveguide 172 that is optically-coupled with a detector waveguide 174, e.g., forming a directional coupler device. In accordance with some embodiments, the waveguides 172 and 174 are tapered (e.g., to promote adiabatic coupling between the waveguides). A detector 176 (e.g., a superconducting detector) is optically-coupled to the detector waveguide 174. In accordance with some embodiments, photons 179 from a photonic source travel through the waveguide 172 until at least a portion of the photons 179 transfer to the waveguide 174 (e.g., adiabatically transfer). In accordance with some embodiments, the photons that transfer to the waveguide 174 are detected by the detector 176 (e.g., cause the detector 176 to transition from a superconducting mode to a non-superconducting mode). In some embodiments, the regions of the waveguides 172 and 174 that are optically-coupled are tapered and one or more other regions are not tapered. In some embodiments, the waveguides 172 and 174 are arranged such that a distance between the tapered regions is constant (e.g., the distance between the tapered regions varies by less than 2%, 5%, or 10%, from a nominal or mean distance between the tapered regions). In some embodiments, (not shown) the waveguides 172 and 174 are arranged such that a distance between the tapered regions varies along their lengths. In some embodiments, the detector 176 includes a linear region with a length that exceeds a width of the optically-coupled region of the waveguide 174 (e.g., to reduce current crowding effects within the detector).

Figure 2A:
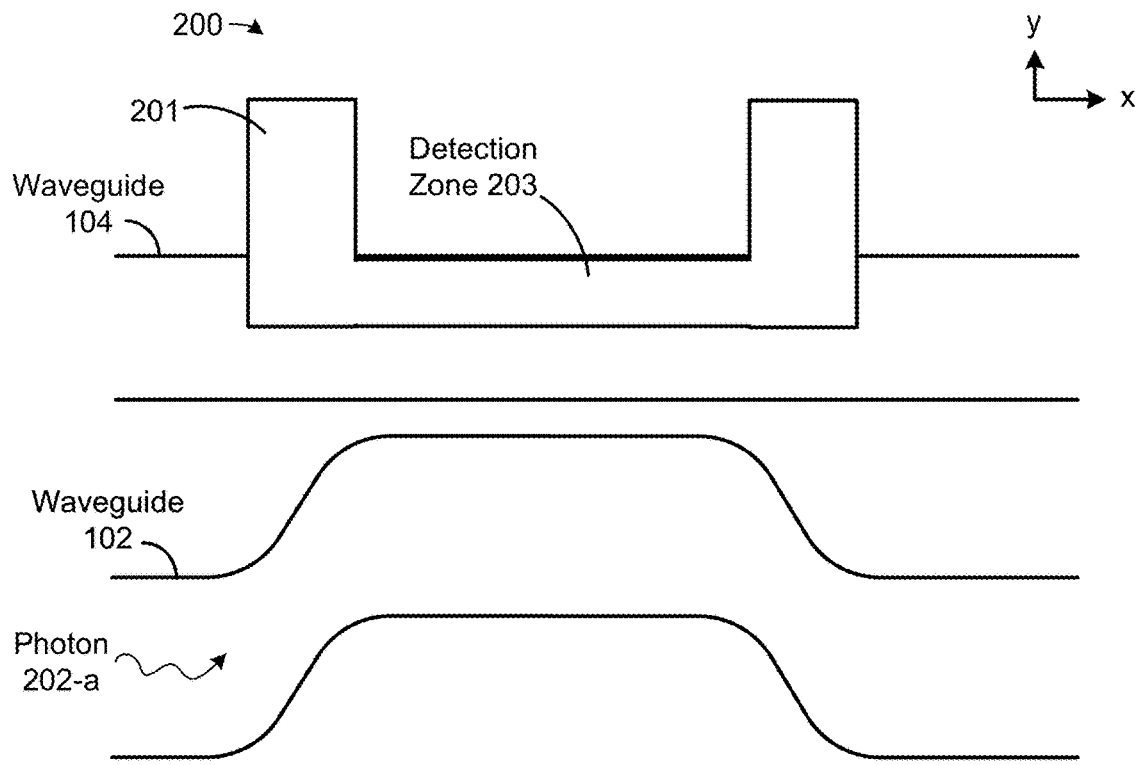
FIGS. 2A-2D are schematic diagrams illustrating a representative operating sequence of a representative optical device in accordance with some embodiments.
Figure 2B:
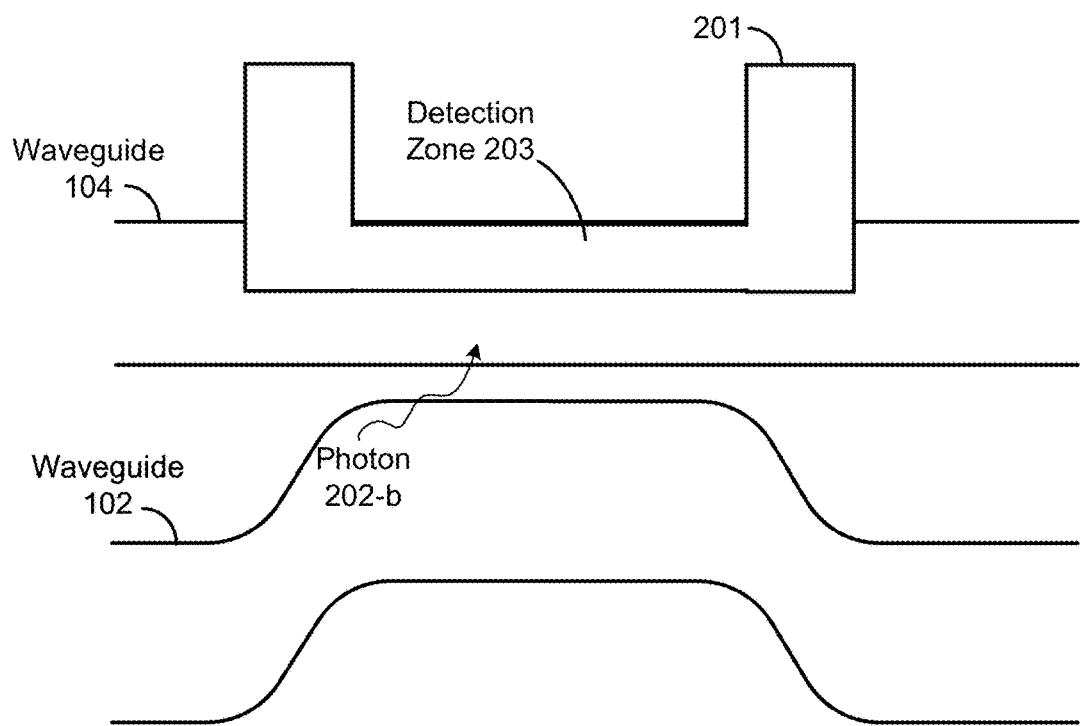
Figure 2C:
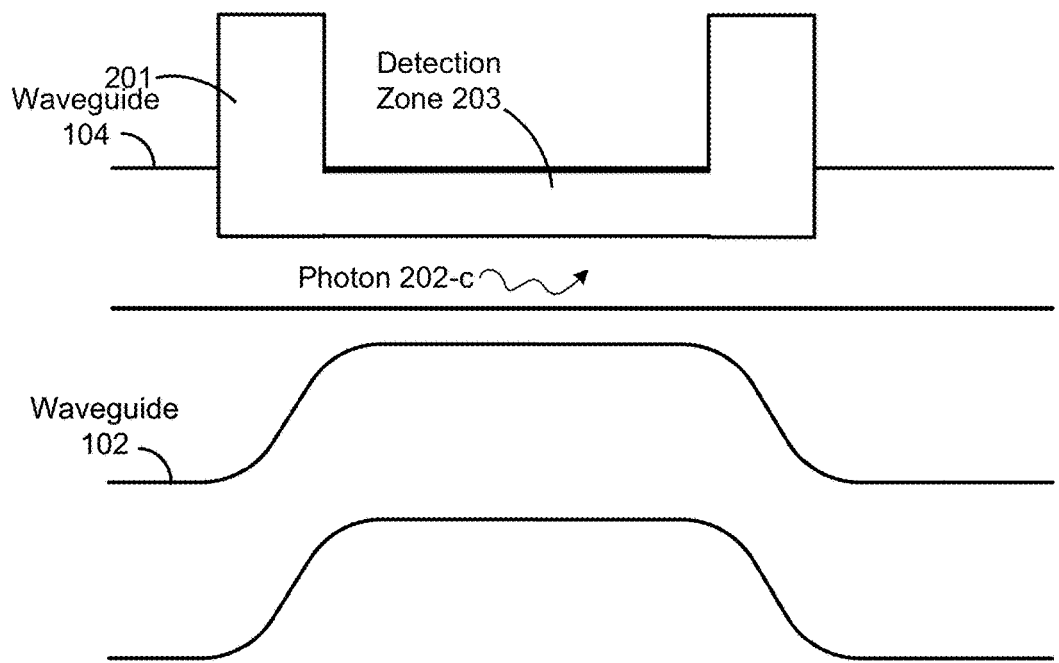
Figure 2D:
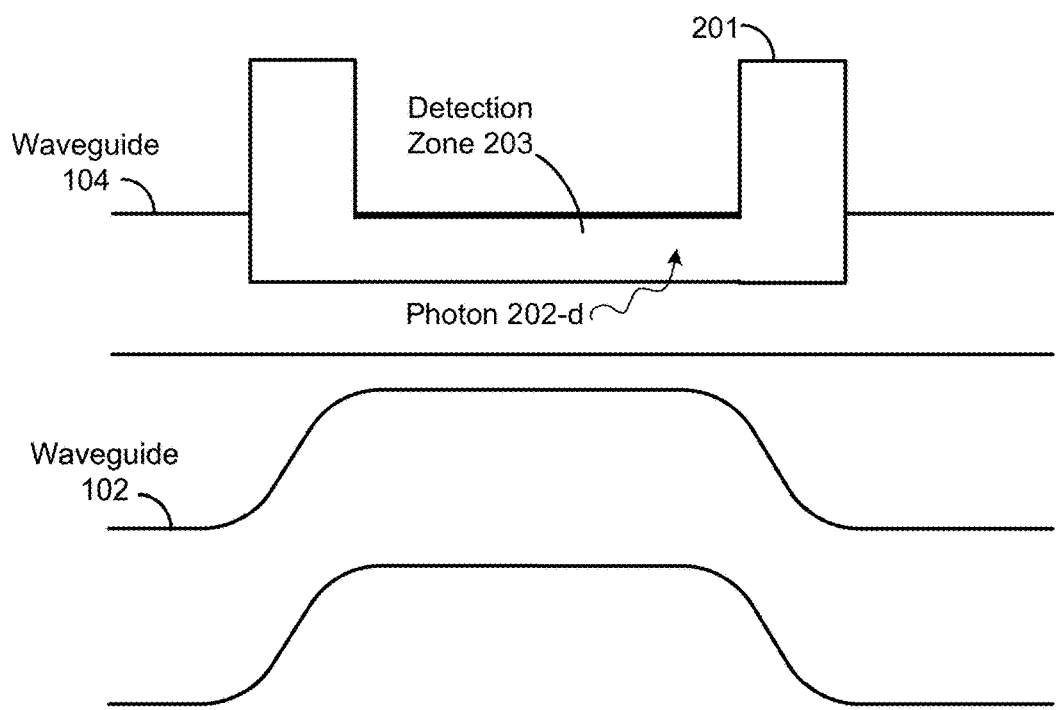

FIGS. 2A-2D are schematic diagrams illustrating a representative operating sequence of an optical device 200 in accordance with some embodiments. The optical device 200 includes a first waveguide 102 having a region in proximity to a second waveguide 104 such that the waveguides 102 and 104 are optically coupled. The optical device 200 further includes a superconducting component 201 having a detection zone 203. In some embodiments, the superconducting component 201 corresponds to the superconducting component 108 or the superconducting component 110. In the example illustrated in FIGS. 2A-2D the superconducting component 201 is offset along the y-axis from a center of the waveguide 104 to illustrate the photon 202 moving to the waveguide 104 (FIG. 2C) prior to being detected by the superconducting component 201 (FIG. 2D). In some embodiments, the superconducting component 201 is adjacent to a center of the waveguide 104 along the y-axis. In some embodiments, the superconducting component 201 has a detection zone 203 that spans the waveguide 104 along the y-axis.

FIG. 2A further shows the optical device 200 at a first time with a photon 202 at a first position 202-a in the waveguide 102. FIG. 2B shows the optical device 200 at a second time, subsequent to the first time, with the photon 202 transferring at position 202-b to the waveguide 104. FIG. 2C shows the optical device 200 at a third time, subsequent to the second time, with the photon 202 at a third position 202-c in the waveguide 104. FIG. 2D shows the optical device 200 at a fourth time, subsequent to the third time, with the photon 202 contacting the superconducting component 201 at a position 202-d within the detection zone 203. In accordance with some embodiments, the detection zone 203 transitions from a superconducting state to a non-superconducting state in response to receiving the photon 202. In accordance with some embodiments the transition of the detection zone 203 causes a change in electrical properties (e.g., a change in a current or voltage) at a readout circuit (e.g., readout circuitry 130).

FIGS. 3A-3B are cross-sectional views of example optical devices in accordance with some embodiments. FIG. 3A illustrates an optical device having a first waveguide 102 adjacent to the second waveguide 104 on a substrate 302. For example, in FIG. 3A, the first waveguide 102 and the second waveguide 104 are located on a same plane that is parallel to the substrate 302. FIG. 3A further illustrates a superconducting component 301 (or portion thereof, such as portion 117, as shown in FIG. 1D) positioned above (e.g., on top of, or vertically stacked with) the second waveguide 104 (or a region thereof, such as region 113, as shown in FIG. 1D). In some embodiments, (not shown) the superconducting component 301 is positioned on a side of the second waveguide 104. In some embodiments, the superconducting component 301 corresponds to the superconducting component 108 or 110. In some embodiments, the waveguides 102 and 104 have a same height and width. In some embodiments, the waveguides 102 and 104 have differing heights and/or differing widths.

In some embodiments, the first waveguide 102 and the second waveguide 104 are separated by an air gap. In some embodiments, the first waveguide 102 and the second waveguide 104 are separated by a dielectric and/or insulating material. In some embodiments, the substrate 302 is composed of silicon or a silicon oxide.

FIG. 3B illustrates an optical device having a first waveguide 102 adjacent to the second waveguide 104. For example, in FIG. 3B, the waveguide 102 is located under (e.g., beneath) the waveguide 104. FIG. 3B further illustrates the waveguide 102 separated from the waveguide 104 by an insulator 304 (e.g., silicon oxide), and the superconducting component 301 adjacent to the waveguide 104 (e.g., the superconducting component 301 is over (e.g., on top of) the waveguide 104). In some embodiments, the superconducting component 301 is located on a side of the waveguide 104. In some embodiments, the waveguide 102 is located over the waveguide 104 (e.g., the waveguide 102 is separated from the waveguide 104 by an insulator 304) and a superconducting component 301 is located under (e.g., beneath), or on a side of, the waveguide 104. In some embodiments, the waveguides 102 and 104 have a same height and width. In some embodiments, the waveguides 102 and 104 have differing heights and/or differing widths.

Figure 4A:
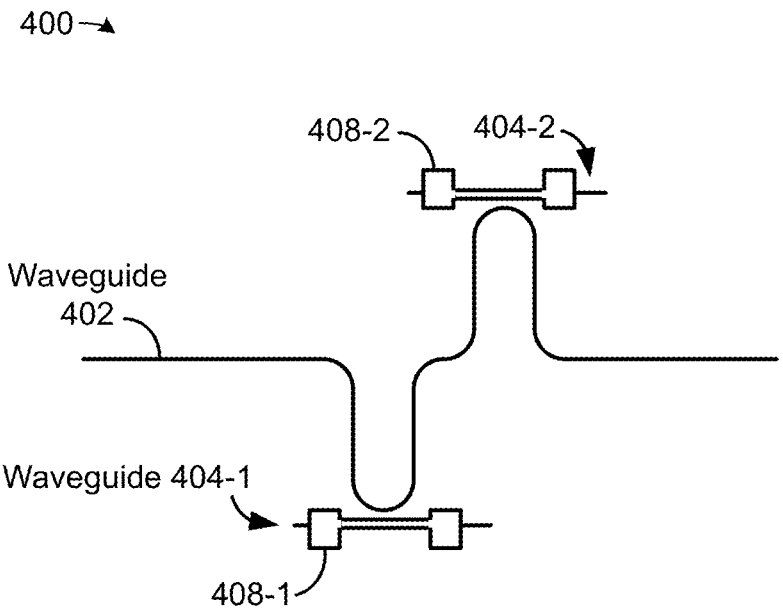
FIGS. 4A-4B are schematic diagrams illustrating representative multi-element optical detector systems in accordance with some embodiments.
Figure 4B:
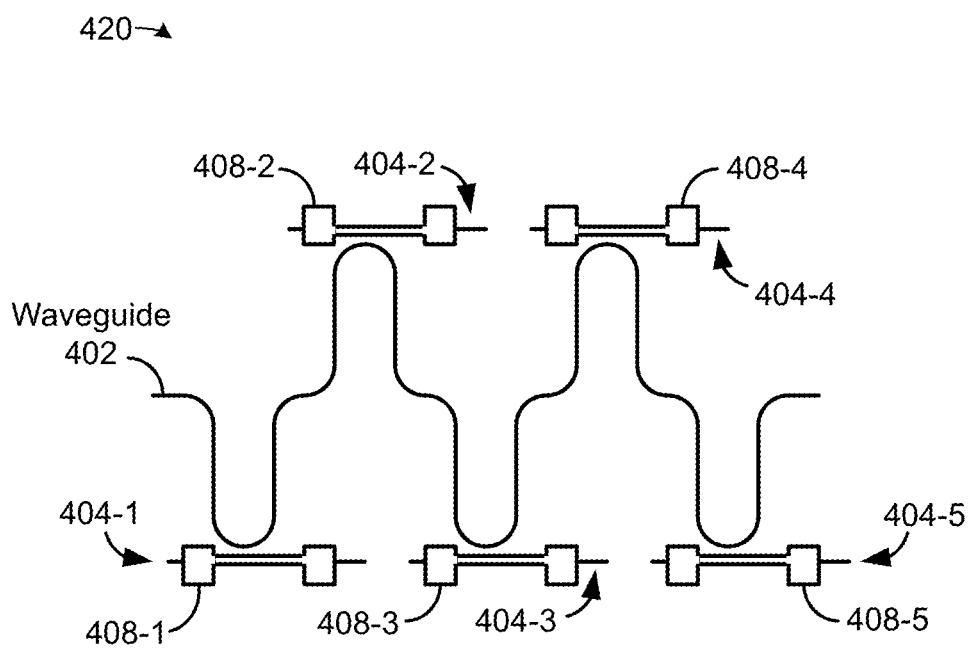

FIGS. 4A-4B are schematic diagrams illustrating representative multi-element detector systems in accordance with some embodiments. FIG. 4A shows an optical system 400 having a first waveguide 402, additional waveguides 404-1 and 404-2, and superconducting components 408 (e.g., 408-1 and 408-2). FIG. 4B shows an optical system 420 having a first waveguide 402, additional waveguides 404 (e.g., 404-1 through 404-5), and superconducting components 408 (e.g., 408-1 through 408-5). Although FIG. 4B shows the optical system 420 having 5 superconducting components 408 and 5 additional waveguides 404, in various embodiments, the optical system 420 has any preselected number of superconducting components 408 and additional waveguides 404 (e.g., 3, 10, or 50 of each).

In accordance with some embodiments, photons in the waveguide 402 transfer to the waveguides 404 and are detected at the corresponding superconducting components 408. In some embodiments, each waveguide 404 is positioned at an equal distance from the waveguide 402, while in other embodiments, at least a subset of the waveguides 404 are positioned at distinct distances from the waveguide 402 (e.g., each has a distinct gap 111 associated with it). In some embodiments, each waveguide 404 has a same length 109, while in other embodiments, at least a subset of the waveguides 404 have distinct lengths. In some embodiments, the waveguide 402 and each waveguide 404 are configured and/or arranged such that there is a preset transfer rate associated with the waveguide 404. For example, the waveguides 402 and 404 in FIG. 4A may be configured and/or arranged such that 50% of photons in the waveguide 402 transfer to the waveguide 404-1 and the remaining 50% of photons in the waveguide 402 transfer to the waveguide 404-2. As another example, the waveguides 402 and 404 in FIG. 4A may be configured and/or arranged such that 10% of photons in the waveguide 402 transfer to the waveguide 404-1 and 70% transfer to the waveguide 404-2. In some embodiments, the superconducting components 408 are essentially identical (e.g., the superconducting components 408 have a same shape of the superconducting component 108), whereas in other embodiments, at least a subset of the superconducting components 408 are distinct from one another (e.g., the superconducting components 408 have distinct shapes). For example, one or more of the superconducting components 408 may have a shape similar to the superconducting component 108 while other superconducting components 408 have a shape similar to the superconducting component 110.

Figure 5:
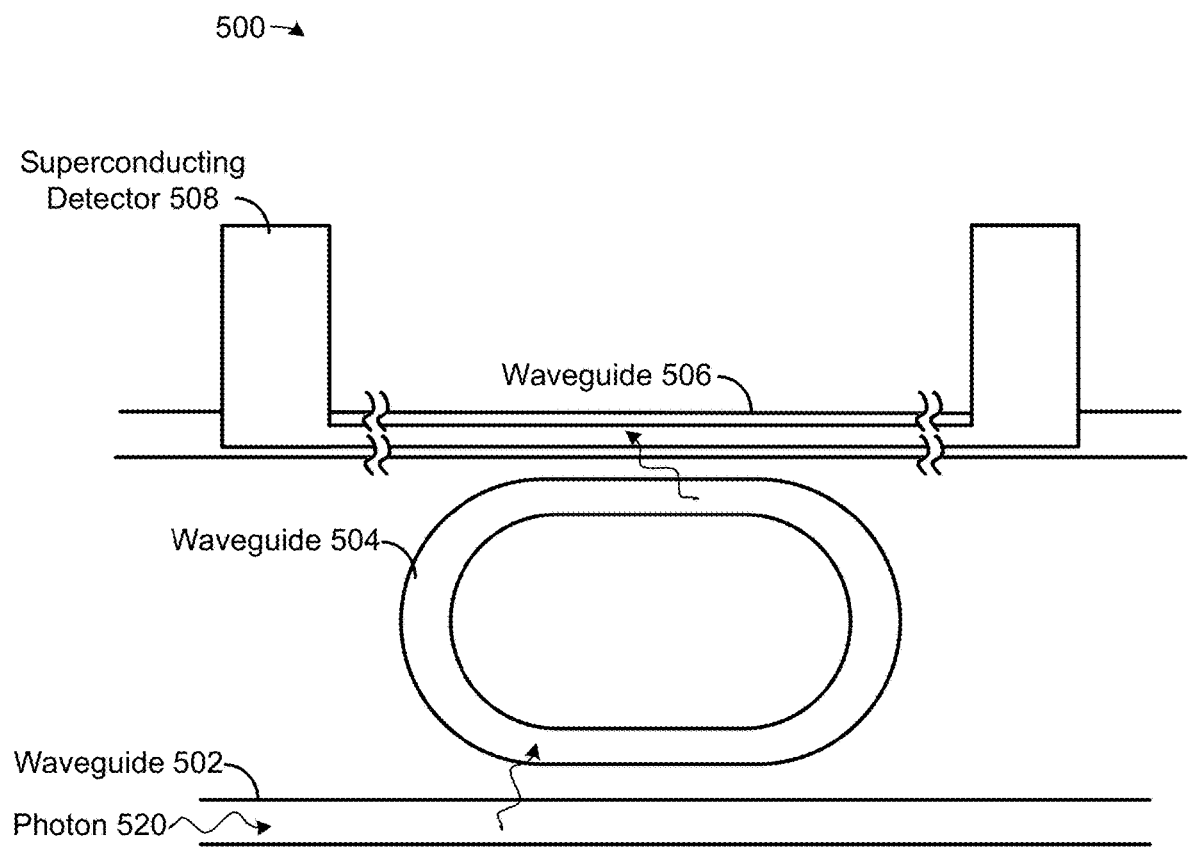
FIG. 5 is a schematic diagram illustrating a representative optical system in accordance with some embodiments.

FIG. 5 is a schematic diagram illustrating an optical system 500 in accordance with some embodiments. The optical system 500 includes a waveguide 502 (e.g., an input waveguide), a waveguide 504 (e.g., a ring resonator), and a waveguide 506 (e.g., a detector waveguide). The waveguide 506 includes a superconducting detector 508 (e.g., one of the superconducting components 108, 110, or 201). In some embodiments, the superconducting detector 508 is integrated with the waveguide 506. In some embodiments, the waveguide 504 is optically-coupled to the waveguide 502 and the waveguide 506. In some embodiments, the waveguide 504 is a closed waveguide loop forming a circular, elliptical, or other loop configuration. In some embodiments, the waveguide 504 is configured to have lossless bends (e.g., configured to have lossless bend radii).

In the example illustrated in FIG. 5, a photon 520 is provide along the waveguide 502. The photon 520 adiabatically transfers from the waveguide 502 to the waveguide 504 (e.g., with a transfer rate of 100%). After transferring, the photon 520 travels along the waveguide 504 until it adiabatically transfers from the waveguide 504 to the waveguide 506. After transferring to the waveguide 506, the photon is absorbed by the superconducting detector 508 resulting in an electrical signal that is provided to a readout circuit (e.g., readout circuitry 130, FIG. 1F) electrically coupled to the detector.

In light of these principles and embodiments, we now turn to certain additional embodiments.

In accordance with some embodiments, a photon detector includes: (1) a first waveguide (e.g., the waveguide 102, FIG. 1D) configured to guide photons from a photon source; (2) a second waveguide (e.g., the waveguide 104, FIG. 1D) that is distinct and separate from the first waveguide and optically-coupled to the first waveguide; and (3) a superconducting component (e.g., the superconducting component 108, FIG. 1D) positioned adjacent to the second waveguide and configured to detect photons within the second waveguide. In some embodiments, the first and second waveguides are composed of a dielectric material, such as silicon. In some embodiments, the second waveguide includes an optically active region, and the superconducting component is positioned adjacent to the optically active region.

In some embodiments, the superconducting component is positioned adjacent to a region of the second waveguide that is optically coupled to the first waveguide.

In some embodiments, the superconducting component detects photons in part by transitioning from a superconducting state to a non-superconducting state in response to receiving light having an intensity above a threshold intensity.

In some embodiments, the superconducting component comprises a straight nanowire (e.g., corresponding to the detection zone 112, FIG. 1E). In some embodiments, the nanowire comprises a superconducting material such as niobium or a niobium alloy. In some embodiments, the nanowire has a width in the range of 10 nm-200 nm. In some embodiments, the nanowire has a length in the range of 1 micron to 100 microns. In some embodiments, the nanowire has a thickness in the range of 3 nm-10 nm.

In some embodiments, the detector further includes one or more electrical contacts (e.g., the contacts 120, FIG. 1F) electrically-connected to the superconducting component. In some embodiments, the electrical contacts comprise metal pads, such as gold or titanium gold metal pads. In some embodiments, the one or more electrical contacts have respective widths greater than a width of the linear superconducting component.

In some embodiments, the superconducting component is adapted to have a uniform current density. In some embodiments, the superconducting component is adapted to have a uniform current density in a detection zone of the superconducting component (e.g., the detection zone of the superconducting component is a straight wire).

In some embodiments, the first waveguide and the second waveguide are phase matched. In some embodiments, phase matching the first and second waveguides includes adjusting a width of the first waveguide, such that it has a larger or narrower width than the second waveguide. In some embodiments, phase matching the first and second waveguides includes adjusting a width of the second waveguide, such that it has a larger or narrower width than the first waveguide. In some embodiments, the first waveguide has a first width and the second waveguide has a second width that is different from (e.g., larger or narrower) the first width (so that the first waveguide is phase matched to the second waveguide integrated with the superconducting component).

In some embodiments, the first waveguide and the second waveguide are configured to enable light to adiabatically transfer from the first waveguide to the second waveguide. For example, the first and second waveguides are configured such that 100% of the light in the first waveguide is transferred to the second waveguide. For example, the first and second waveguides are configured such that more than 90%, 91%, 92%, 93%, 94%, 95%, 96%, 97%, 98%, 99%, or 99.9% of the light in the first waveguide is transferred to the second waveguide.

In some embodiments, the first waveguide and the second waveguide are configured to have a preset light transfer rate between the first and second waveguides. In some embodiments, the preset light transfer rate is in the range of 100% to 1%.

In some embodiments, the detector further including: (1) a third waveguide (e.g., waveguide 404-2, FIG. 4A) that is distinct and separate from the first waveguide and optically coupled to the first waveguide; and (2) a second superconducting component (e.g., superconducting component 408-2, FIG. 4A) positioned adjacent to the third waveguide and configured to detect photons within the third waveguide. In some embodiments, the third waveguide is distinct and separate from and the second waveguide. In some embodiments, the second superconducting component is distinct and separate from the superconducting component.

In some embodiments, the first waveguide and the second waveguide are located on a same horizontal plane (e.g., as illustrated in FIG. 3A). In some embodiments, the first waveguide is located next to the second waveguide.

In some embodiments, the first waveguide is located on a first horizontal plane and the second waveguide is located on a second horizontal plane that is distinct and separate from the first horizontal plane (e.g., as illustrated in FIG. 3B). In some embodiments, the first waveguide is located over or under the second waveguide. In some embodiments, the superconducting component is a linear superconducting component.

In accordance with some embodiments, a method for detecting photons includes: (1) receiving one or more photons from a photon source; (2) directing the one or more photons through a first waveguide (e.g., as illustrated in FIG. 2A); (3) transferring (e.g., adiabatically or evanescently) at least one photon of the one or more photons from the first waveguide to a second waveguide that is distinct and separate from the first waveguide (e.g., as illustrated in FIG. 2B); and (4) detecting the at least one photon within the second waveguide using a photon sensor positioned adjacent to the second waveguide (e.g., as illustrated in FIG. 2D).

In some embodiments, transferring at least one of the photons from the first waveguide to the second waveguide comprises optically transferring a preset ratio (e.g., a percentage) of the one or more photons to the second waveguide (e.g., 5%, 10%, 50%, 99%, or 100%).

In some embodiments: (1) the photon sensor includes a superconducting component (e.g., the superconducting component 201, FIG. 2A); and (2) detecting the at least one photon using the photon sensor comprises detecting the at least one photon based on a transition of the superconducting component, triggered by the at least one photon, from a superconducting state to a non-superconducting state. In some embodiments, the superconducting component is adapted to have a uniform current density (e.g., by having a linear shape or by avoiding a bend).

In accordance with some embodiments, a method of fabricating a photon detector includes: (1) providing a substrate; (2) depositing a layer of a waveguide material over the substrate; (3) adapting the layer of the waveguide material into a first waveguide and a second waveguide that is distinct and separate from the first waveguide; and (4) forming a photon sensor over the second waveguide.

In accordance with some embodiments, a method of fabricating a photon detector includes: (1) providing a substrate (e.g., the substrate 302, FIG. 3B); (2) depositing a first layer of a waveguide material (e.g., corresponding to the waveguide 102, FIG. 3B) over the substrate; (3) adapting the first layer of the waveguide material into a first waveguide; (4) depositing a second layer of a waveguide material (e.g., corresponding to the waveguide 104, FIG. 3B) over at least the first waveguide; (5) adapting the second layer of the waveguide material into a second waveguide that is distinct and separate from the first waveguide; and (6) forming a photon sensor over the second waveguide (e.g., the superconducting component 301, FIG. 3B).

In some embodiments, forming the photon sensor includes: (1) depositing a layer of a superconducting material over at least the second waveguide; and (2) adapting the layer of the superconducting material into a superconducting component.

In accordance with some embodiments, a method of fabricating a photon detector includes: (1) providing a substrate; (2) depositing a first layer of a waveguide material over the substrate; (3) adapting the first layer of the waveguide material into a first waveguide; (4) depositing a second layer of a waveguide material over the first layer; (5)

adapting the second layer of the waveguide material into a second waveguide; (6) depositing a third layer over the second layer; and (7) adapting the third layer into a photon sensor.

In some embodiments, a method includes: (1) providing a substrate; (2) depositing a first layer on the substrate; (3) adapting the first layer into a photon sensor; (4) depositing a second layer on the first layer; (5) adapting the second layer into a first waveguide; (6) depositing a third layer on the second layer; and (7) adapting the third layer into a second waveguide.

In some embodiments, adapting the third layer comprises removing one or more portions of the third layer to define a nanowire. In some embodiments, the third layer comprises a layer of a superconducting material.

In some embodiments, each waveguide material comprises a dielectric material. In some embodiments, the first layer of a waveguide material includes a first dielectric material, and the second layer of a waveguide material includes a second dielectric material. In some embodiments, the first dielectric material is distinct from the second dielectric material. In some embodiments, the first dielectric material is essentially identical to the second dielectric material.

In some embodiments, the first waveguide and the second waveguide are configured to have a preset light transfer rate between the first and second waveguides. In some embodiments, the preset light transfer rate is based on a length of a section of the first waveguide that is adjacent to the second waveguide (e.g., the length 109, FIG. 1C).

In some embodiments, the method further includes adjusting the preset light transfer rate by adjusting the length of the section of the first waveguide that is adjacent to the second waveguide. In some embodiments, the method further includes phase matching the first waveguide and the second waveguide (e.g., by adjusting a width and/or length of the first waveguide, and/or adjusting a gap between the waveguides).

In some embodiments, phase matching the first waveguide and the second waveguide includes adjusting one or more dimensions of the first waveguide and/or one or more dimensions of the second waveguide. In some embodiments, phase matching the first waveguide and the second waveguide includes adjusting a width of the first waveguide and/or a width of the second waveguide. In some embodiments, phase matching the first waveguide and the second waveguide includes adjusting a height of the first waveguide and/or a height of the second waveguide.

In accordance with some embodiments, a photon detector device includes: (1) a first photonic waveguide (e.g., the waveguide 102, FIG. 1D) including a first region (e.g., the region 105) and a second region that is distinct from and mutually exclusive to the first region of the first photonic waveguide, the first region of the first photonic waveguide having a first end and a second end that is opposite to the first end of the first region of the first photonic waveguide, where the first region of the first photonic waveguide is configured to receive one or more photons from the first end of the first region of the first photonic waveguide toward the second end of the first region of the first photonic waveguide; (2) a second photonic waveguide (e.g., the waveguide 104, FIG. 1D) that is distinct and separate from the first photonic waveguide, the second photonic waveguide including a first region (e.g., the region 113) and a second region that is distinct from and mutually exclusive to the first region of the second photonic waveguide, the first region of the second photonic waveguide being adjacent to the first region of the first photonic waveguide and having a first distance (e.g., the distance 107) to the first photonic waveguide, the second region (e.g., the region 115) of the second photonic waveguide having a second distance (e.g., the distance 103), to the first photonic waveguide, that is greater than the first distance, the first region of the second photonic waveguide having a first end and a second end that is opposite to the first end of the first region of the second photonic waveguide, whereby at least a subset of the one or more photons transmitted from the first end of the first region of the first photonic waveguide toward the second end of the first region of the first photonic waveguide is transferred to the second photonic waveguide (e.g., the first region of the second photonic waveguide); and (3) a superconducting component (e.g., superconducting component 108, FIG. 1D) having a first portion (e.g., the portion 117) and a second portion that is distinct from and mutually exclusive to the first portion of the superconducting component, the first portion of the superconducting component being adjacent to the first region of the second photonic waveguide and extending from a first position adjacent to the first end of the first region of the second photonic waveguide (e.g., the first position is located above the first end of the first region of the second photonic waveguide) toward a second position adjacent to the second end of the first region of the second photonic waveguide (e.g., the second position is located above the second end of the first region of the second photonic waveguide), whereby the first portion of the superconducting component transitions from a superconducting state to a non-superconducting state in response to one or more photons above a preselected detection threshold being transmitted through at least a portion of the first region of the second photonic waveguide. In some embodiments, the first and second photonic waveguides are composed of a dielectric material, such as silicon. In some embodiments, at least one of the first coupling region and the second coupling region has a tapered width (e.g., as illustrated in FIG. 1G).

In some embodiments, the first portion of the superconducting component has a substantially linear shape (e.g., as illustrated by the portion 117 in FIG. 1D). In some embodiments, the first portion of the superconducting component is linear. In some embodiments, the first portion of the superconducting component does not have a bend that is less than 120 degrees. In some embodiments, the first portion of the superconducting component does not have a bend that is less than 90 degrees. In some embodiments, the first portion of the superconducting component does not have a bend that is greater than 240 degrees. In some embodiments, the first portion of the superconducting component does not have a bend that is greater than 270 degrees. In some embodiments, the superconducting component has one or more portions (e.g., outside the first portion) that are not linear (e.g., superconducting component 108 shown in FIG. 1D has two right angle corners extending from portion 117).

In some embodiments, the first region of the first photonic waveguide has a substantially linear shape (e.g., as illustrated by the region 105 in FIG. 1D). In some embodiments, the first region of the first photonic waveguide is linear. In some embodiments, the first region of the first photonic waveguide does not have a bend that is less than 120 degrees. In some embodiments, the first region of the first photonic waveguide does not have a bend that is less than 90 degrees. In some embodiments, the first region of the first photonic waveguide does not have a bend that is greater than 240 degrees. In some embodiments, the first region of the first photonic waveguide does not have a bend that is greater than 270 degrees. In some embodiments, the first photonic waveguide has one or more regions that are not linear (e.g., first waveguide 102 in FIG. 1D has bends outside the first region).

In some embodiments, the first region of the second photonic waveguide has a substantially linear shape (e.g., as illustrated by the region 113 in FIG. 1D). In some embodiments, the first region of the second photonic waveguide is linear. In some embodiments, the first region of the second photonic waveguide does not have a bend that is less than 120 degrees. In some embodiments, the first region of the second photonic waveguide does not have a bend that is less than 90 degrees. In some embodiments, the first region of the second photonic waveguide does not have a bend that is greater than 240 degrees. In some embodiments, the first region of the second photonic waveguide does not have a bend that is greater than 270 degrees. In some embodiments, the second photonic waveguide has one or more regions that are not linear (e.g., outside the first region).

In some embodiments, the first region of the second photonic waveguide is longer than the first region of the first photonic waveguide (e.g., the region 113 is longer than the region 105 in FIG. 1D). In some embodiments, the first portion of the superconducting component is longer than the first region of the first photonic waveguide. In some embodiments, the first portion of the superconducting component has a substantially same length as the first region of the second photonic waveguide.

In some embodiments, the first region of the first photonic waveguide is phase matched with the first region of the second photonic waveguide in combination with the first portion of the superconducting component.

In some embodiments, the first region of the first photonic waveguide has a first width and the first region of the second photonic waveguide has a second width that is less than the first width. For example, a width of the region 113 in FIG. 1D is less than a width of the region 105 in accordance with some embodiments.

In some embodiments, (1) the first portion of the superconducting component is located over the first region of the second photonic waveguide; (2) the first position is located over the first end of the first region of the second photonic waveguide; and (3) the second position is located over the second end of the first region of the second photonic waveguide.

In some embodiments, the superconducting component extends beyond the second position (e.g., the superconducting component extends beyond the second end of the first region of the second photonic waveguide). In some embodiments, the first portion of the superconducting component is longer than the first region of the second photonic waveguide.

In some embodiments, a first layer includes both the first region of the first photonic waveguide and the first region of the second photonic waveguide (e.g., as illustrated in FIG. 3A). In some embodiments, the first region of the first photonic waveguide is positioned side-by-side with the first region of the second photonic waveguide. In some embodiments, the first region of the second photonic waveguide is positioned over the first region of the first photonic waveguide (e.g., as illustrated in FIG. 3B).

In some embodiments, the first region of the first photonic waveguide is positioned over the first region of the second photonic waveguide and the first region of the second photonic waveguide is positioned over the first portion of the superconducting component.

In some embodiments, the detector device further includes a readout circuit (e.g., readout circuitry 130, FIG. 1F) configured to measure a resistance, or impedance, of at least the first portion of the superconducting component (e.g., the readout circuit is configured to measure a resistance of the superconducting component).

In some embodiments, the detector further includes a current source (e.g., the current source 132, FIG. 1F) configured to provide a first current to at least the first portion of the superconducting component.

It will also be understood that, although the terms first, second, etc. are, in some instances, used herein to describe various elements, these elements should not be limited by these terms. These terms are only used to distinguish one element from another. For example, a first waveguide could be termed a second waveguide, and, similarly, a second waveguide could be termed a first waveguide, without departing from the scope of the various described embodiments. The first waveguide and the second waveguide are both waveguides, but they are not the same waveguide unless explicitly stated as such.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. A photon detector, comprising:
    a first optical waveguide configured to guide photons from a photon source, the first optical waveguide having a first linear coupling region and the first optical waveguide having a first width;
    a second optical waveguide that is distinct and separate from the first optical waveguide, the second optical waveguide having a second linear coupling region that is optically-coupled to the first linear coupling region of the first optical waveguide, wherein:

the first linear coupling region of the first optical waveguide has a first length and is disposed, along the first length of the first linear coupling region, parallel to and at a distance from the second linear coupling region of the second optical waveguide, and the second optical waveguide has a second width that is different from the first width; and a coupling coefficient between the first linear coupling region and the second linear coupling region is based on the first length; and a superconducting detector component configured to detect photons within the second optical waveguide, the superconducting detector component having a linear detector portion positioned adjacent to, and optically-coupled with, the second linear coupling region.

2. The photon detector of claim 1, wherein the superconducting detector component detects photons in part by transitioning from a superconducting state to a non-superconducting state in response to receiving light having an intensity above a threshold intensity.

3. The photon detector of claim 1, further comprising one or more electrical contacts electrically connected to the superconducting detector component and optically decoupled from the second optical waveguide.

4. The photon detector of claim 1, wherein the linear detector portion is adapted to have a uniform current density.

5. The photon detector of claim 1, wherein the first optical waveguide and the second optical waveguide are positioned and sized to enable light to adiabatically transfer from the first optical waveguide to the second optical waveguide.

6. The photon detector of claim 1, wherein the first optical waveguide and the second optical waveguide are positioned and sized to enable light to evanescently transfer from the first optical waveguide to the second optical waveguide.

7. The photon detector of claim 1, wherein the first optical waveguide and the second optical waveguide are configured to have a preset light transfer rate between the first and second optical waveguides.

8. The photon detector of claim 1, wherein at least one of the first linear coupling region and the second linear coupling region has a tapered width.

9. The photon detector of claim 1, further comprising:

a third optical waveguide that is distinct and separate from the first optical waveguide and the second optical waveguide and optically-coupled to the first optical waveguide; and a second superconducting component positioned adjacent to the third optical waveguide and configured to detect photons within the third optical waveguide.

10. The photon detector claim 1, wherein the first linear coupling region of the first optical waveguide is configured to propagate photons in a direction parallel to the first length of the first linear coupling region.

11. A photon detector, comprising:

a first optical waveguide configured to guide photons from a photon source, the first optical waveguide having a first linear coupling region and the first optical waveguide having a first width;

a second optical waveguide that is distinct and separate from the first optical waveguide, the second optical waveguide having a second linear coupling region that is optically-coupled to the first linear coupling region of the first optical waveguide, wherein:

the first linear coupling region of the first optical waveguide has a first length and is disposed, along the first length of the first linear coupling region, parallel to and at a distance from the second linear coupling region of the second optical waveguide, and the second optical waveguide has a second width that is different from the first width; and the first linear coupling region of the first optical waveguide is configured to propagate photons in a direction parallel to the first length of the first linear coupling region; and a superconducting detector component configured to detect photons within the second optical waveguide, the superconducting detector component having a linear detector portion positioned adjacent to, and optically-coupled with, the second linear coupling region.

* * * * *